(12) United States Patent
Zweigle et al.

(10) Patent No.: US 7,480,580 B2
(45) Date of Patent: Jan. 20, 2009

(54) APPARATUS AND METHOD FOR ESTIMATING SYNCHRONIZED PHASORS AT PREDETERMINED TIMES REFERENCED TO AN ABSOLUTE TIME STANDARD IN AN ELECTRICAL SYSTEM

(75) Inventors: Gregory C. Zweigle, Pullman, WA (US); Luther S. Anderson, Pullman, WA (US); Armando Guzman-Casillas, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 118 days.

(21) Appl. No.: 11/504,788

(22) Filed: Aug. 15, 2006

(65) Prior Publication Data

US 2007/0086134 A1 Apr. 19, 2007

Related U.S. Application Data

(60) Provisional application No. 60/727,764, filed on Oct. 18, 2005.

(51) Int. Cl.
*G01R 27/00* (2006.01)
(52) U.S. Cl. ..................................... 702/106; 702/60
(58) Field of Classification Search ................ 702/60, 702/72, 75, 106, 62, 89; 361/85, 93.1, 115, 361/80
See application file for complete search history.

(56) References Cited

U.S. PATENT DOCUMENTS

| 4,719,469 | A | 1/1988 | Beier |
| 4,821,294 | A | 4/1989 | Thomas |
| 4,829,298 | A | 5/1989 | Fernandes |
| 5,006,846 | A | 4/1991 | Granville |
| 5,224,011 | A | 6/1993 | Yalla |
| 5,446,682 | A | 8/1995 | Janke |
| 5,498,956 | A | 3/1996 | Kinney |
| 5,592,393 | A | 1/1997 | Yalla |

(Continued)

FOREIGN PATENT DOCUMENTS

EP 1324454 A1 7/2003

(Continued)

OTHER PUBLICATIONS

Wide Area Measurement, Monitoring, Protection and Control—Industrial IT for Energy System Operation.

(Continued)

*Primary Examiner*—Bryan Bui
(74) *Attorney, Agent, or Firm*—Eugene M. Cummings, P.C.

(57) ABSTRACT

An apparatus and method estimates a plurality of synchronized phasors at predetermined times referenced to an absolute time standard in an electrical power system. The method includes acquiring and determining a frequency of a power system signal, sampling the power system signal at a sampling interval rate based on a frequency of the power system signal to form signal samples, and generating a plurality of acquisition time values based on an occurrence of each of the signal samples at a corresponding plurality of different times referenced to the absolute time standard. The method further includes adjusting a phasor of each of the signal samples based on a time difference between a corresponding selected acquisition time value and a predetermined time referenced to an absolute time standard to form the plurality of synchronized phasors.

62 Claims, 12 Drawing Sheets

U.S. PATENT DOCUMENTS

| | | | |
|---|---|---|---|
| 5,736,961 | A | 4/1998 | Fenton |
| 5,963,582 | A | 10/1999 | Stansell |
| 5,995,911 | A | 11/1999 | Hart |
| 6,075,987 | A | 6/2000 | Camp |
| 6,104,729 | A | 8/2000 | Hellum |
| 6,127,970 | A | 10/2000 | Lin |
| 6,141,196 | A * | 10/2000 | Premerlani et al. ............ 361/78 |
| 6,160,841 | A | 12/2000 | Stansell |
| 6,236,949 | B1 | 5/2001 | Hart |
| 6,252,863 | B1 | 6/2001 | Raby |
| 6,313,934 | B1 | 11/2001 | Fortenberry |
| 6,429,785 | B1 | 8/2002 | Griffin |
| 6,446,682 | B1 | 9/2002 | Viken |
| 6,570,534 | B2 | 5/2003 | Cohen |
| 6,618,648 | B1 | 9/2003 | Shirota et al. |
| 6,642,700 | B2 | 11/2003 | Slade |
| 6,662,124 | B2 | 12/2003 | Schweitzer |
| 6,694,270 | B2 | 2/2004 | Hart |
| 6,735,523 | B1 | 5/2004 | Lin |
| 6,735,535 | B1 | 5/2004 | Kagan |
| 6,745,175 | B2 | 6/2004 | Pierce |
| 6,751,653 | B2 | 6/2004 | Austin |
| 6,754,597 | B2 | 6/2004 | Bertsch |
| 6,762,714 | B2 | 7/2004 | Cohen |
| 6,845,301 | B2 | 1/2005 | Hamamatsu |
| 6,845,333 | B2 * | 1/2005 | Anderson et al. ............ 702/65 |
| 6,859,742 | B2 | 2/2005 | Randall |
| 6,983,393 | B2 | 1/2006 | Truchard |
| 2003/0220752 | A1 | 11/2003 | Hart |
| 2004/0059469 | A1 | 3/2004 | Hart |
| 2004/0093177 | A1 | 5/2004 | Schweitzer, III |
| 2006/0029105 | A1 | 2/2006 | Kasztenny |
| 2006/0224336 | A1 * | 10/2006 | Petras et al. ................. 702/62 |
| 2006/0247874 | A1 * | 11/2006 | Premerlani et al. ............ 702/64 |

FOREIGN PATENT DOCUMENTS

| | | | |
|---|---|---|---|
| EP | 1324455 | A1 | 7/2003 |
| WO | WO03055028 | A1 | 7/2003 |

OTHER PUBLICATIONS

National Instruments—NI Developer Zone—Synchronizing and Correlating Measurements to a Global Timebase with GPS published Feb. 1, 2006.

Using Synchronized Phasor Angle Difference for Wide-Area Protection and Control by Enrique Martinez, Nicolas Juarez, Comision Federal de Electricidad, Mexico and Armando Guzman, Greg Aweigle, Jean Leon, Schweitzer Engineering Laboratories, Inc.

R.O. Burnett, et al., Synchronized Phasor Measurements of a Power System Event, IEEE Transactions on Power Systems, Aug. 13, 1994, pp. 1643-1650, vol. 9, No. 3.

Mark Adamiak, et al., Synchrophasors: Definition, Measurement, and Application, Power Systems 2005 Conference, Marden Center, Clemson University, Mar. 8-11, 2005, 14 pages.

Rafael San Vincente, et al., DSP-Microcontroller Implementations of a Simplified Algorithm for Synchrophasor Calculation, 2nd International Conference on Electrical and Electr, 2005, 4 pages.

Tsuyoshi Funaki, et al., Error Estimation and Correction of DFT in Synchronized Phasor Measurement, Transmission and DistributionConference and Exhibition 2002: Asia Pacific, 6 pages.

A.G. Phadke, Synchronized Phasor Measurements—A Historical Overview; Transmission and Distribution Conference and Exhibition 2002: Asia Pacific, IEEE/PES, 4 pages.

Jian Li, et al., The Framework and Algorithm of a new Phasor Measurement Unit, 2004 IEEE International Conference on Electricity Deregulation, Restructuring and Power Technolo, 6 pages.

Yutaka Ota, et al., Evaluation of Stability and Electric Power Quality in Power System by Using Phasor Measurements; Power System Technology, 2000, Proceedings, PowerCon 200, 6 pages.

A.G. Phadke, Synchronized Phasor Measurements in Power Systems, IEEE Computer Applications in Power, Apr. 1993, 6 pages.

Benmouyal, et al., Synchronized Phasor Measurement in Protective Relays, 29th Annual Western Protective Relay Conference, Spokane, WA Oct. 22-24, 2002, Sep. 27, 2002.

Comparative Testing of Synchronized Phasor Measurement Units by J. Depablos, Student Member, IEEE, Virginia Tech; V. Centeno, Member, IEEE, Virginia Tech; Arun G. Phadke, Life Fellow, IEEE, Virginia Tech and Michael Ingram, Member, IEEE, Tennessee Valley. Authority, Power Engineering Society General Meeting, 2004, IEEE vol. 1, Jun. 6-10, 2004, pp. 948-954.

* cited by examiner

APPARATUS AND METHOD FOR ESTIMATING SYNCHRONIZED PHASORS AT PREDETERMINED TIMES REFERENCED TO AN ABSOLUTE TIME STANDARD IN AN ELECTRICAL SYSTEM

CROSS-REFERENCE TO RELATED APPLICATION

This application claims benefit under 35 U.S.C. §119(e) of U.S. Provisional Application entitled "Method of Phasor Estimation at Predetermined Time Instants", filed on Oct. 18, 2005, having Ser. No. 60/727,764, naming Gregary C. Zweigle, Armando Guzman-Casillas, and Luther Scott Anderson as inventors, the complete disclosure thereof being incorporated by reference.

BACKGROUND OF THE INVENTION

The present invention generally relates to monitoring, metering, protection and control of electrical systems, and more specifically, to an apparatus and method for estimating synchronized phasors at predetermined times referenced to an absolute time standard in an electrical system.

Knowledge of the state of an electrical network is important in order to recognize and understand disturbances in the electrical network, provide protection functionality, provide metering, monitor the electrical network, and determine control actions. This is especially true for critical electrical networks such as an electric power system or grid where energy is generated and transported from the generating facilities to locations and loads requiring the energy. Electrical power systems include a variety of power system elements such as electrical generators, electrical motors, power transformers, power transmission lines, buses and capacitors, to name a few. The electric power systems also include various monitoring devices, control devices, metering devices, and protective devices (e.g. protective relays). In most cases, these devices are microprocessor-based or "intelligent" electronic devices (IEDs), that utilize phasors (i.e., a constant complex number representing a sinusoidal function of time) to perform their respective function(s). The phasors are derived from local or shared remote measurements sampled from currents and/or voltages of the electric power system.

Regardless of whether the phasors are derived from local or remote measurements, the accuracy of such measurements is of paramount importance when achieving a desired level of electrical power system performance. Such accuracy is predicated on both the accuracy of the measurement itself and the accuracy of the knowledge of the acquisition time of the measurement.

Acquisition time accuracy has been addressed via time-keeping systems that distribute highly accurate time, referenced to an absolute time standard, which have been used to drive the acquisition time of a voltage or current measurement. The absolute time standard typically includes one of the coordinated universal time (UTC) or international atomic time (TAI), distributed by the Global Positioning System (GPS) and then with a time protocol such as the Inter Range Instrumentation Group time code standard (IRIG) or over Ethernet. Systems employing absolute time reference schemes utilize voltage and/or current measurements that are sampled from analog voltage and/or current signal(s) with respect to the absolute time. As a result, both the measurement value and the time at which the measurement value is acquired can be obtained, processed, stored, and/or transported with high accuracy.

In applications such as power system state determination, it is desirable to sample voltage and/or current signals at many points across the electric power system at the same moment. In that case, using an absolute time standard, the voltages and/or current signals are sampled at a coordinated time instant to allow synchronization of the acquisition across the network. The resulting voltage and/or current measurements are processed to form "synchronized phasors" which are then utilized to enable new applications for the monitoring, metering, protection, and control of the electric power generation, transmission, and distribution network of the electric power system. The synchronized phasors may also be stored for subsequent use in analyzing a fault or other anomalous electrical power system condition.

Real-time monitoring of the present state of the electrical power system is often accomplished using a state-estimation algorithm. In general, the state-estimation algorithm utilizes measured voltage and power measurements that are collected from monitored points or nodes in the electric power system. The measured quantities are then used to estimate the state of the electric power system. One inherent limitation of state-estimation algorithms however is the time delay introduced as a result of the estimation of the power system state. It is therefore desirable to minimize the delay due to determination of the estimated state values, as well as any delay between the determination of the estimated state values and any subsequent control action (i.e. a control latency).

An electric power system utilizing the synchronized phasors can aid in reducing the control latency inherent in state-estimation algorithms. Because each synchronized phasor represents a present state value of the power system, derivation of estimated state values is not required, and the mechanisms which determine the control action are able to act more quickly. A further application for the use of synchronized phasors includes the dynamic or continuous recording of the variable electric power system magnitude and phase angle. Utilizing such a dynamic recording enables subsequent analysis of changes in the electric power system due to, for example, opening or closing a line, equilibrium differences between generation and load, or unstable power swings. A number of types of protection functions such as those found in protective relays may also benefit from the use of synchronized phasors. For example, synchronized phasors may be used to improve detection of the loss of electric power system synchronization when generators begin operation at different speeds. When the loss of synchronization is detected, a remedial action scheme can be quickly employed to "island" a portion(s) of the electric power system or shed a load.

As mentioned above, phasors are calculated from stepped-down analog voltage and current signals of the electric power system. When received from respective voltage and current transformers, the analog voltage and/or current signals are filtered, sampled with respect to the local power system frequency (e.g., 60 Hz) and processed to form phasors suitable for use by a microprocessor or other intelligent device. Synchronous phasors are similarly calculated except that they are sampled with respect to an absolute time standard and derived with respect to a coordinated time instant.

For example, one method of computing the synchronized phasor is described in U.S. Pat. Nos. 6,845,333 and 6,662,124 assigned to Schweitzer Engineering Laboratories, Inc. In one embodiment, the absolute time reference is generated via GPS, transmitting time and location information that is used by local receivers of the intelligent electronic devices. The acquisition may be based on deriving each sample instant from the absolute time reference, and recording the time at which the sample is taken.

To be meaningful, a synchronized phasor or phasor quantity must be referenced to a standard to allow correlation to other synchronized phasors even when the synchronized phasors are acquired from multiple electric power system locations with varying states and frequencies. One method known in the art that may be used to reference a synchronized phasor includes correlating an associated sampled voltage or current signal to a phasor with a frequency equal to the nominal power system frequency and with a predetermined phase that has been set in all of the IEDs or measuring devices. Alternatively, a single analog quantity can be chosen as the reference for all IEDs communicating and sharing the synchronized phasors. For example, the frequency at one point in the distribution scheme is sometimes chosen as a reference for all devices computing synchronized phasors. In some cases a feature of a reference signal, such as a zero crossing, can provide the reference for the phase value.

SUMMARY OF THE INVENTION

In accordance with an embodiment of the invention, an apparatus estimates a plurality of synchronized phasors at predetermined times referenced to an absolute time standard in an electrical power system. The apparatus includes a sample controller configured to determine a frequency of a power system signal acquired at each location of the electrical power system where the synchronized phasors are calculated, a sampling means configured to sample the power system signal at a sampling interval rate based on a frequency of the power system signal to form a plurality of signal samples, a time controller configured to generate a plurality of acquisition time values based on an occurrence of each of the plurality signal samples at a corresponding plurality of different times referenced to the absolute time standard. Each of the plurality of acquisition time values is associated with a phasor magnitude and a phasor phase angle derived from each of the plurality of signal samples. The apparatus also includes a phasor estimator configured to adjust the phasor magnitude and the phasor phase angle for each of the plurality of signal samples based on a time difference between a corresponding selected acquisition time value of the plurality of acquisition time values and a predetermined time of the predetermined times referenced to the absolute time standard to form the plurality of synchronized phasors.

In accordance with another embodiment of the invention, a method estimates a plurality of synchronized phasors at predetermined times referenced to an absolute time standard in an electrical power system. The method includes acquiring a power system signal at a location of the electrical power system, determining a frequency of the power system signal, sampling the power system signal at a sampling interval rate based on a frequency of the power system signal to form a plurality of signal samples, and generating a plurality of acquisition time values based on an occurrence of each of the plurality signal samples at a corresponding plurality of different times referenced to the absolute time standard. Each of the plurality of acquisition time values is associated with a phasor magnitude and a phasor phase angle derived from each of the plurality of signal samples. For each of the plurality of signal samples, the method further includes adjusting the phasor magnitude and the phasor phase angle based on a time difference between a corresponding selected acquisition time value of the plurality of acquisition time values and a predetermined time of the predetermined times referenced to the absolute time standard to form the plurality of synchronized phasors. According to one aspect of the invention, the location of the power system is local and the power system signal is a local analog input signal. According to another aspect of the invention, the location of the power system is remote and the power system signal is a digitized remote analog input signal.

In accordance with a further embodiment of the invention, a method estimates a plurality of synchronized phasors at predetermined times referenced to an absolute time standard in an electrical power system. The method includes acquiring a power system signal at a location of the electrical power system, determining a frequency of the power system signal, sampling the power system signal at a sampling interval rate based on a frequency of the power system signal to form a plurality of signal samples, and generating a plurality of acquisition time values based on an occurrence of each of the plurality signal samples at a corresponding plurality of different times referenced to the absolute time standard, each of the plurality of acquisition time values associated with a phasor magnitude and a phasor phase angle derived from each of the plurality of signal samples. For each of the plurality of signal samples, the method further includes interpolating the phasor magnitude and rotating phasor phase angle to form a corresponding plurality of referenced phasor magnitudes and referenced phasor phase angles of the plurality of synchronized phasors based on a time difference between a corresponding selected acquisition time value of the plurality of acquisition time values and a predetermined time of the predetermined times referenced to the absolute time standard.

It should be understood that the present invention includes a number of different aspects and/or features which may have utility alone and/or in combination with other aspects or features. Accordingly, this summary is not an exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed.

DETAILED DESCRIPTION OF THE PREFERRED EMBODIMENTS

In contrast to existing systems, the present invention provides a calculation of synchronized phasors at predetermined times referenced to an absolute time standard, in a manner that eliminates the need for further time alignment, and allowing correlation to all synchronized phasors in the system, even when they are acquired from multiple electric power system locations with varying states and differing frequencies. The sampling interval rate is variable, based on the varying frequency of the local power system signal and can furthermore be based on an exact multiple of the frequency of the local power system signal. No corrections for frequency deviations are required. It provides synchronized phasors which are further processed for power system protection applications requiring sampling intervals also based on a multiple of the local power system frequency. It does not require sampling to be synchronized or based on the same frequency between measuring devices (e.g. IEDs) which are estimating the synchronized phasors. Control of the sampling interval is not based on an absolute time reference. The invention is simple in implementation and is computationally inexpensive. It allows the predetermined absolute time reference moment to be uniformly determined between the IEDs utilizing the phasors, or to be independently locally determined. It provides for the synchronized phasors to be referenced to a phasor of predetermined phase and frequency. Applications can provide signals for protection, monitoring, recording, metering, control, analyzing, or further processing due to the absolute time reference moment providing a common scale against which the signals can be compared.

Figure 1:
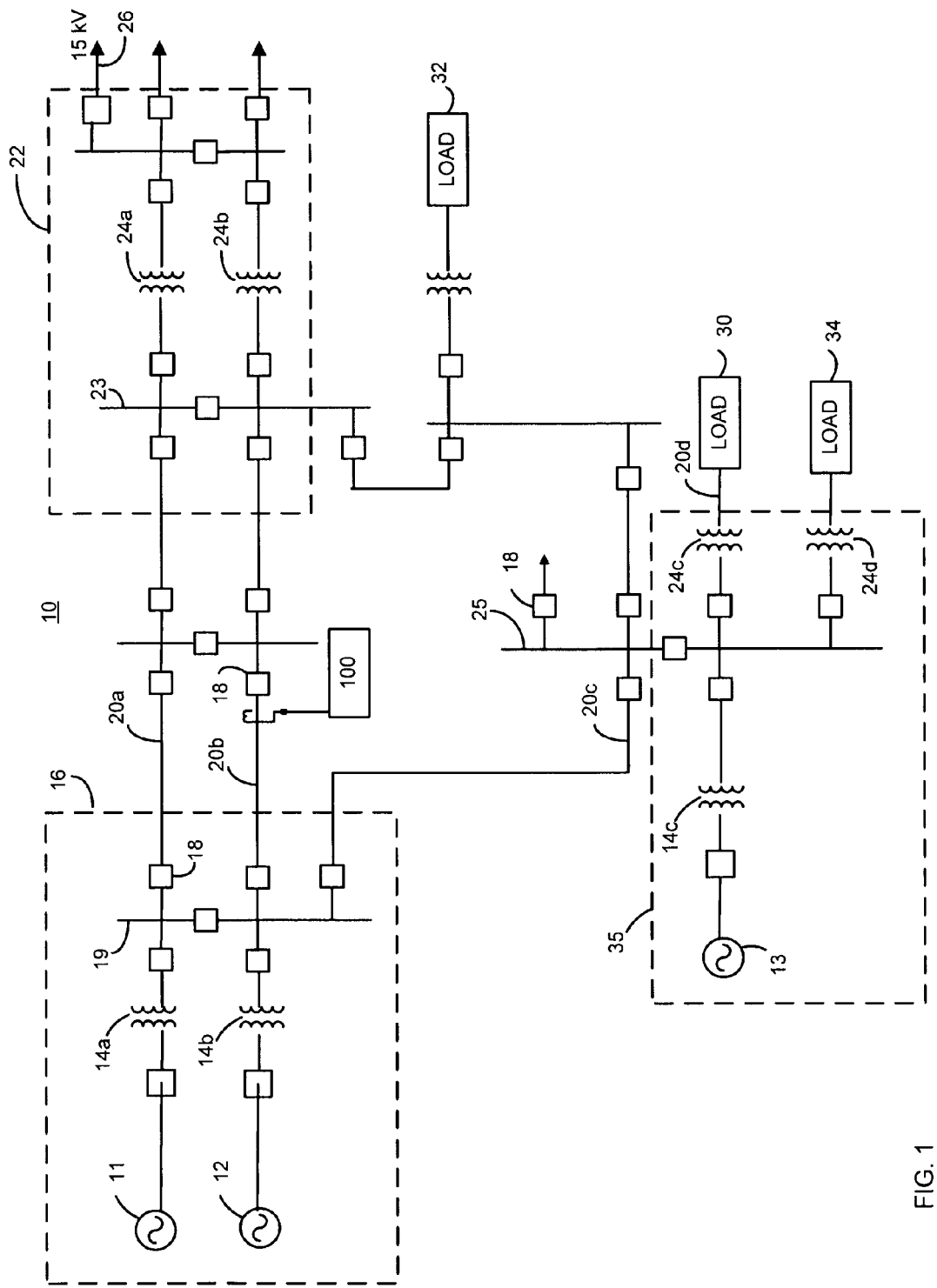
FIG. 1 is a single line schematic of a power system that may be utilized in a typical wide area network.

FIG. 1 is a single line schematic diagram of a power system 10 that may be utilized in a typical wide area. As illustrated in FIG. 1, the power system 10 includes, among other things, three synchronous generators 11, 12 and 13, configured to generate three-phase sinusoidal waveforms such as 12 kV sinusoidal waveforms, three step-up power transformers 14a, 14b and 14c, configured to increase the generated waveforms to a higher voltage sinusoidal waveforms such as 138 kV sinusoidal waveforms and a number of circuit breakers 18. The step-up power transformers 14a, 14b, 14c operate to provide the higher voltage sinusoidal waveforms to a number of long distance transmission lines such as the transmission lines 20a, 20b, 20c and 20d. In an embodiment, a first substation 16 may be defined to include the two synchronous generators 11 and 12, the two step-up power transformers 14a and 14b and associated circuit breakers 18, all interconnected via a first bus 19. A second substation 35 may be defined to include the synchronous generator 13, the step-up power transformer 14c and associated circuit breakers 18, all interconnected via a second bus 25. At the end of the long distance transmission lines 20a, 20b, a third substation 22 may be defined to include two step-down power transformers 24a and 24b configured to transform the higher voltage sinusoidal waveforms to lower voltage sinusoidal waveforms (e.g., 15 kV) suitable for distribution via one or more distribution lines 26 to loads such as a load 32. The second substation 35 also includes two step-down power transformers 24c and 24d to transform the higher voltage sinusoidal waveforms, received via the second bus 25, to lower voltage sinusoidal waveforms suitable for use by respective loads 30 and 34.

A number of intelligent electronic devices (IED) are connected at various points in the electric power system 10. For ease of discussion however, only one IED 100 is shown operatively connected to the transmission line 20b via one transformer. In general, an IED can be configured to perform one or more of power system protection (e.g., a line current differential protection), automation (e.g., reclosing a circuit breaker), control (e.g., capacitor bank switching) and metering (e.g., power consumption calculation).

Figure 2:
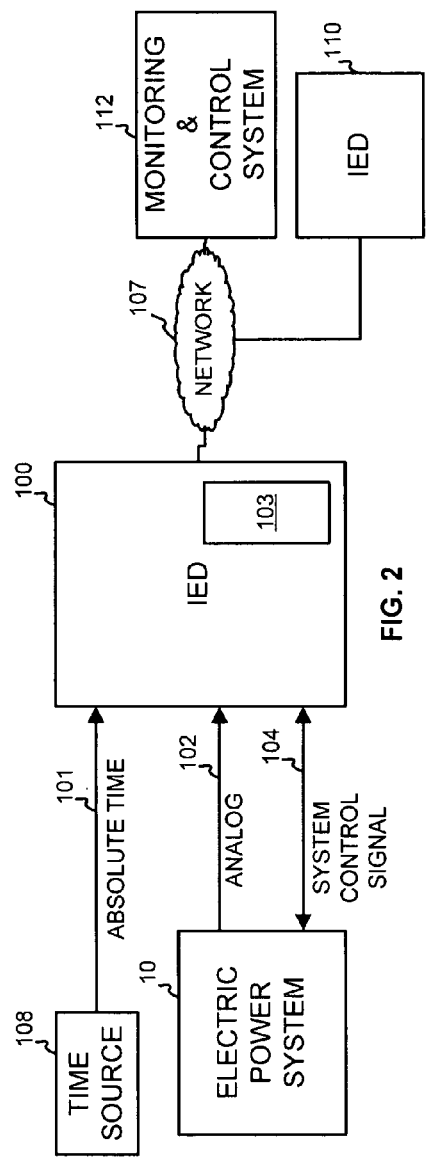
FIG. 2 is a block diagram of the power system and the IED of FIG. 1 in conjunction with a time source configured to deliver an absolute time, according to an embodiment of the invention.

FIG. 2 is a block diagram of the power system 10 and the IED 100 in conjunction with a time source 108 configured to deliver an absolute time to the IED 100. FIG. 2 also includes a second IED 110 and a monitoring and control system 112 operatively coupled the IED 100 via a communications network 107. The network 107 may be any suitable network adapted to enable transmission between the various interconnected devices of FIG. 2. For example, the network 107 may be configured as an Ethernet based local area network or wide area network, etc., and may include a number of universal asynchronous receiver transmitters. The monitoring and control system 112 is configured to, among other things, provide SCADA (Supervisory Control and Data Acquisition) and EMS (Energy Management System) functions by applying synchrophasor information received from additional devices of the power system 10.

As discussed below in connection with a number of figures, the IED 100 is configured to estimate synchronized phasors at predetermined time instants that are based on an absolute time reference and, in some embodiments, referencing to a phasor with predetermined phase and frequency. Referring to FIG. 2, the IED 100 has an input configured to receive an input analog signal 102, and a bidirectional signal configured to provide a system control signal 104 to the power system 10 (e.g., a signal to the open circuit breaker 18 to isolate a portion of the first substation 16 from the remainder of the power system 10). The system control signal 104 may also provide control information to IED 100. The input analog signal 102, which may be representative of one or more local voltages (e.g., an A-phase to ground voltage, B-phase to ground voltage and a C-phase to ground voltage) and/or one or more local currents (e.g., an A-phase current, B-phase current and C-phase current), is received by IED 100 via voltage and/or current transformers connected to one or more phases of the power system 10. Alternatively, the input analog signal 102 may be representative of a remote voltage and/or a current signal received by the IED 100 from a remote acquisition device monitoring the power system 10.

A time source 108 provides an absolute time reference 101 to the IED 100 where the absolute time 101 is a synchronized to an absolute time standard such as UTC, and distributed using GPS, preferably formatted in an Inter Range Instrumentation Group time code standard (IRIG) signal for receipt by IED 100. Additional formats, distribution schemes, and time standards may also be utilized.

In general, the input analog signal 102 received from the power system 10 is filtered, multiplexed, sampled and digitized to form a signal of analog instantaneous samples suitable for use by a microcontroller 103 of the IED 100. In one embodiment, the microcontroller 103 includes a CPU, or a microprocessor, a program memory (e.g., a Flash EPROM) and a parameter memory (e.g., an EEPROM). As will be appreciated by those skilled in the art, other suitable microcontroller configurations may be utilized. Further, although discussed in terms of the microcontroller 103, it should be noted that the embodiments presented and claimed herein may be practiced using an FPGA or other equivalent.

Depending on the IED 100 configuration, the microcontroller 103 executes a protection function and/or an automation function and/or a control function and/or a metering function. Further, the microprocessor 103 executes a computer program or control logic scheme to estimate the synchronized phasors 111 at predetermined times referenced to an absolute time standard, discussed below in connection with FIGS. 3-11, according to an embodiment of the invention. For ease of discussion, the computer program or control logic scheme to estimate synchronized phasors is referred to herein as a synchronized phasor estimation method that may or may not be in addition to a protection function and/or an automation function and/or a control function and/or a metering function of the IED 100.

Figure 3:
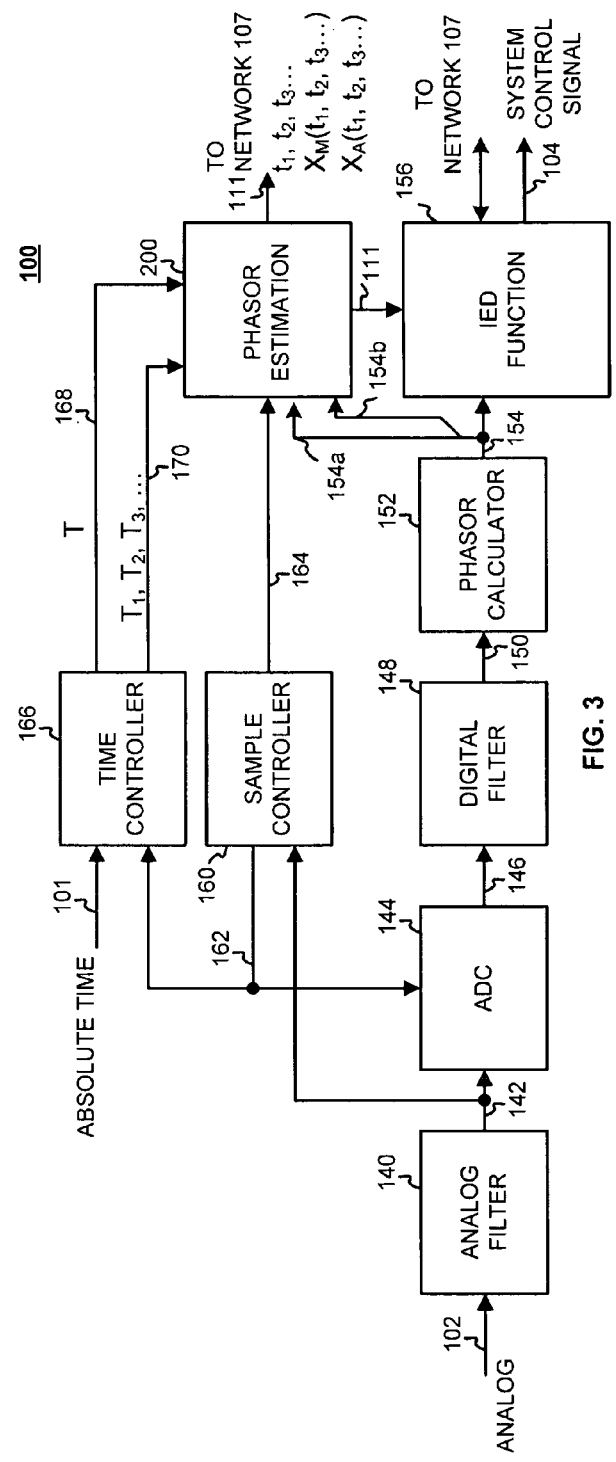
FIG. 3 is a functional block diagram of the IED of FIG. 1, according to an embodiment of the invention.

FIG. 3 is a functional block diagram of the IED 100, according to an embodiment of the invention. Although discussed as functional blocks, it should be understood that the IED 100 may be implemented in hardware, software, firmware or a combination thereof. Referring to FIG. 3, the IED 100 includes an analog filter 140 having an input for receiving the input analog signal 102 and an output for providing a filtered analog instantaneous signal 142 to an analog-to-digital converter (ADC) 144. When received by the ADC 144, the filtered analog instantaneous signal 142 is sampled at a rate determined by a frequency of the input analog signal 102 to generate a sampled analog instantaneous signal 146. The series of filtered signal samples representative of the filtered analog instantaneous signal 142 can be generated at a frequency associated with an integer multiple of the input analog signal 102.

The IED 100 also includes a digital filter 148 having an input for receiving the sampled analog instantaneous signal 146. In operation, the digital filter 148 rejects unwanted signal characteristics such as harmonic distortion, thermal noise, and exponentially decaying DC offsets, from the sampled analog instantaneous signal 146 in order to provide a filtered signal 150 via its output. The filtered signal 150 represents digitized, filtered instantaneous samples of the input analog signal 102, where the instantaneous samples of the input analog signal 102 are taken at a frequency of the input analog signal 102. A typical impulse response of the digital filter 148 is a full-cycle cosine waveform response or a half-cycle cosine waveform response.

The filtered signal 150 is provided to a phasor calculator 152 where a series of instantaneous phasors 154 are calculated based on the filtered signal 150. Although not separately illustrated, the phasor calculator 152 may include a 90 degree phase shift function in order to provide a quadrature representation suitable for the calculation of magnitudes and phase angles. As noted above, for ease of subsequent calculations by the microcontroller 103, each of the instantaneous phasors 154 is expressed in polar coordinate form to include an instantaneous phasor magnitude 154*a* and an instantaneous phasor phase angle 154*b*. Alternatively, a representation as a complex value may be utilized, depending on the nature of the IED function 156. In this case each of the instantaneous phasors 154 is expressed as an instantaneous phasor real component 154*a* and an instantaneous phasor imaginary component 154*b*. For ease of discussion, both versions, the magnitude and phase combination and the real part imaginary part combination, are referred to herein as an instantaneous phasor, or in general as a phasor. The instantaneous phasor phase angle 154*b* is referenced to, for example, (one of the input analog signal(s) 102. The phasor calculator 152 may also include calculation of sequence values such as positive sequence, negative sequence, or zero sequence. These additional quantities may also be part of instantaneous phasors 154.

An IED function 156 is configured to receive the instantaneous phasors 154, and utilizing an algorithm or equivalent, perform the appropriate IED function (e.g., protection, automation, control, metering) to determine a status of the power system 10. Based on the determined status, the system control signal 104 is provided to the power system 10, other IEDs, etc. The system control signal 104 may be transmitted directly to an actuating device associated with the IED 100, or may be transmitted via the network 107 where it is coordinated with other control signals for further decoding and processing by a remote actuating device. The IED function 156 is also configured to utilize the synchronized phasors 111 to perform power system functions, such as causing a breaker to trip. The IED function 156 may also include a link to the network 107 in order to transmit and receive various data related to protection, monitoring, automation and control, and to receive synchronized phasors 111 from other IEDs coupled to the power system 10.

In addition to the signal processing functions described above, the IED 100 includes a sample controller 160 having an input for receiving the filtered analog instantaneous signal 142. The sample controller 160 also includes two outputs; a first output for providing a control signal stream 162 to the ADC 144 and a time controller 166, and a second output configured to provide a local frequency 164 to a phasor estimation 200. The sample controller 160 has no control input based on the absolute time 101 and therefore does not provide a control signal stream 162 to the ADC 144 based on the absolute time 101.

The local frequency 164 is representative of a frequency (e.g., 60.2 Hz) of the input analog signal 102. In one embodiment, the local frequency 164 is derived from the filtered analog instantaneous signal 142 using one of any number of well-known methods. For example, an interval between two or more zero crossings of the filtered analog instantaneous signal 142 may be measured as a sinusoidal period. The interval(s) between the zero crossings can be filtered to reduce noise, harmonics and other undesirable distortions. The local frequency 164 may then be calculated as a reciprocal of the sinusoidal period. The local frequency 164 may also be derived from one of the filtered analog instantaneous signal 142, the input analog signal 102, the sampled analog instantaneous signal 146, the filtered signal 150 and/or the instantaneous phasors 154.

After deriving the local frequency 164, an equal number of integer samples instants may be placed within each period to provide a basis for the control signal stream 162. For example, each period may include 8 sampling instants yielding nominally 480 sampling instants of the filtered analog instantaneous signal 142 per second for a local frequency of 60 Hz. Thus, sampling instants of the control signal stream 162 are based on the local frequency.

In one embodiment the sample controller 160 operates to generate a series of the sampling instants at the local sampling interval rate, herein referred to as the control signal stream 162, where the sampling instants are an integer number multiple of the frequency of the input analog signal 102. As appreciated by one skilled in the art, the sampling instants may be based on other multiples of the frequency of the input analog signal 102. For ease of discussion, the control signal stream 162 may be viewed as a pulse train of sampling instants. In general however, the control signal stream 162 may be configured in one of any number of signal configurations adapted to control analog multiplexers, gain circuits, sample and hold switches, programmable logic, and other devices.

In addition to receiving the control signal stream 162, the time controller 166 includes an input for receiving the absolute time 101. As described above, the absolute time 101 is a time referenced to an absolute time standard and communicated via a protocol such as IRIG. The time controller 166 utilizes the absolute time 101 to generate a series of instantaneous time values 168 where each is denoted as T. Each instantaneous time value 168 is representative of one decoded instant of the absolute time 101, and is updated periodically (e.g., once per second), depending on the absolute time standard and the nature of the implementation.

For example, if the absolute time 101 is formatted in using an IRIG-B protocol, a single bit stream of 100 pulses per second is transmitted. This means that 100 bits of information, representing one data frame of time information, are transmitted every second. Each one-second data frame contains information about the day of the year (1-366), hours, minutes, and seconds (e.g., Aug. 17, 2005 at 4:13.000000 PM). Accordingly, in one embodiment, the instantaneous time value 168 is representative of one decoded instant of the absolute time 101, and is updated once per second.

Using the time information provided by the absolute time 101, the time controller 166 also monitors the control signal stream 162 to form the acquisition time value stream 170 having a series of acquisition time values denoted as $T_1$, $T_2$, $T_3$, . . . . Each acquisition time value is associated with one sampling instant of the analog input signal and is therefore associated with one instantaneous phasor magnitude 154a and one instantaneous phasor phase angle 154b.

For example, if the control signal stream 162 is a series of pulses where the leading edge of each pulse represents the beginning of one ADC operation of the filtered analog instantaneous signal 142, the acquisition time value stream 170 may be a series of time values coinciding with the time of the leading edge of each pulse, yielding an acquisition time value stream 170 having a number of acquisition time values per second as determined by the local frequency 164. Thus the acquisition time value $T_2$ may occur approximately 2 milliseconds (ms) after the acquisition time value $T_1$, the acquisition time value $T_3$ may occur approximately 2 ms after the acquisition time value $T_2$ or approximately 4 ms after the acquisition time value $T_1$, the acquisition time value $T_4$ may occur approximately 2 ms after the acquisition time value $T_3$ or approximately 6 ms after the acquisition time value $T_1$, and so on, and each acquisition time values encodes the value of the sampling instant of the filtered analog instantaneous signal. Depending on the phase relationship between the sampling instants of the control signal stream 162 and the absolute time 101, a time offset from the absolute time 101 may be used to express each of the acquisition time values $T_1$, $T_2$, $T_3$, . . . of the acquisition time value stream 170. In this case, the time controller 166 may record the interval from the absolute time 101 to the time of a next control signal stream 162 pulse, and then add this recorded interval to the absolute time 101 to generate each of the acquisition time values $T_1$, $T_2$, $T_3$, . . . of the acquisition time stream 170.

Figure 4:
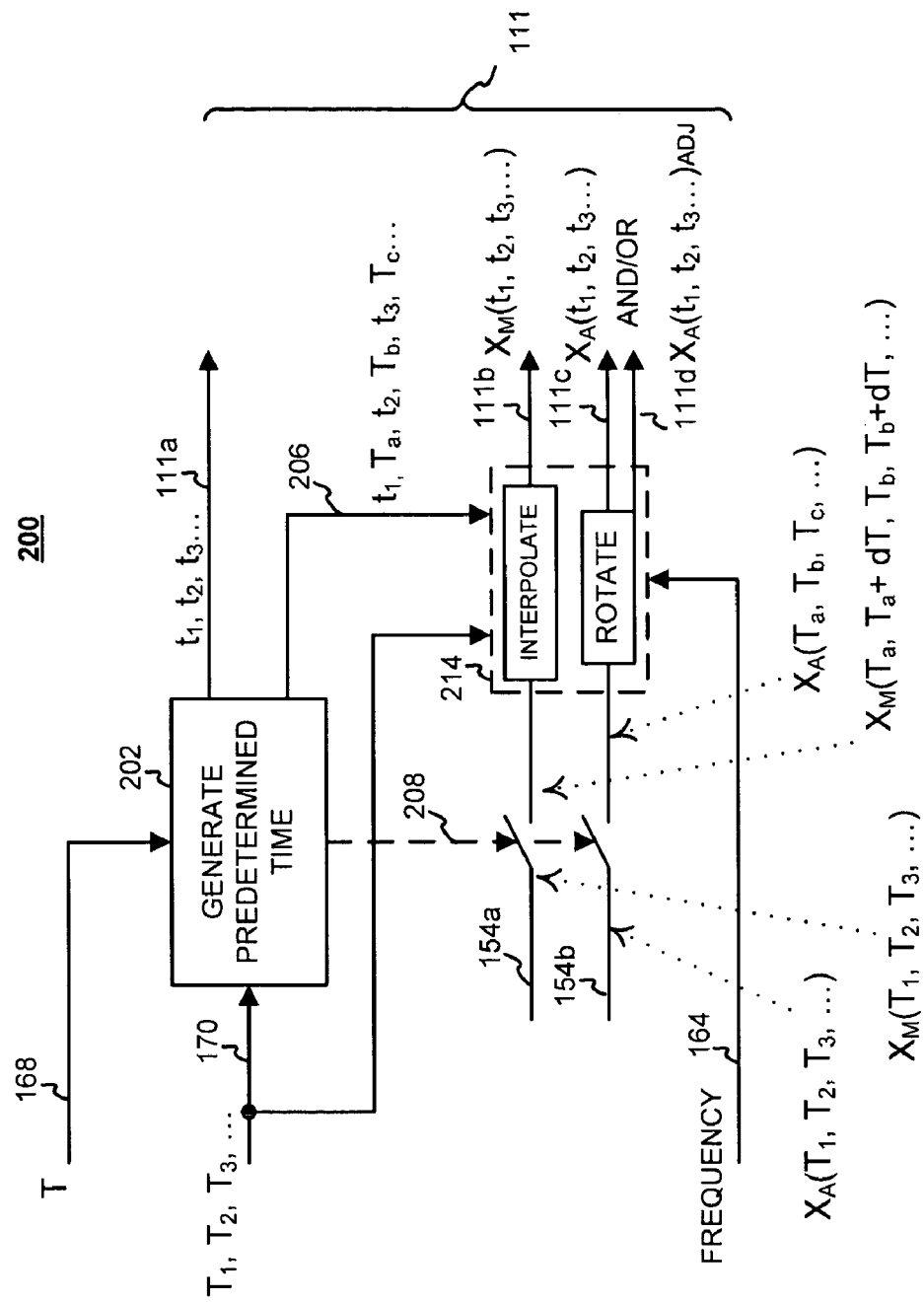
FIG. 4 is a functional block diagram of the phasor estimation of FIG. 3, according to an embodiment of the invention.

In general, the phasor estimation 200 is configured to generate synchronized phasors 111 indicative of the input analog signal 102. The synchronized phasors 111 are magnitude adjusted and phase-aligned to the absolute time 101, and in some embodiments further phase aligned to reference to a phasor with predetermined phase and frequency. FIG. 4 is a functional block diagram of the phasor estimation 200, according to an embodiment of the invention. The phasor estimation 200 operates to generate the synchronized phasors 111 in response to receipt of a series of the instantaneous phasor magnitudes 154a, a corresponding series of instantaneous phasor phase angles 154b, the local frequency 164, the instantaneous time values 168 and the acquisition time value stream 170. Although described as functional blocks, it should be understood that the phasor estimation 200 may be implemented in hardware, software, firmware or a combination thereof.

Referring to FIG. 4, the phasor estimation 200 includes a generate predetermined time function 202 and a phasor adjustment block 214 operatively coupled to the generate predetermined time function 202. The generate predetermined time function 202 has a first input for receiving the instantaneous time values 168 T and a second input for receiving the acquisition time values $T_1$, $T_2$, $T_3$, . . . of the acquisition time value stream 170. The phasor estimation 200 also has a first output for providing predetermined times $t_1$, $t_2$, $t_3$ . . . referenced to the absolute time standard 111a. The predetermined times $t_1$, $t_2$, $t_3$ . . . referenced to the absolute time standard 111a may be a result of synchronization across all or a portion of the power system 10 (e.g., synchronized phasors), or may be specific to the IED 100, therefore generated and used locally only, depending on the desired application of the synchronized phasors 111. In any case, the predetermined times $t_1$, $t_2$, $t_3$ . . . referenced to the absolute time standard 111a are the desired time values at which the magnitudes and phase angles of the synchronized phasors 111 are to be estimated from the magnitudes and phase angles of phasors calculated at known times (e.g., the acquisition time values $T_1$, $T_2$, $T_3$, . . . ).

The generate predetermined time function 202 further has a second output for providing a time value pair stream 206 configured as a series of pairs of corresponding time values to the phase adjustment block 214. Each of the corresponding time value pairs includes one predetermined time referenced to the absolute time standard 111a and a corresponding selected acquisition time value from a series of selected acquisition time values $T_a$, $T_b$, $T_c$ . . . . Each of the selected acquisition time values $T_a$, $T_b$, $T_c$ . . . corresponds to one of the acquisition time values $T_1$, $T_2$, $T_3$, . . . of the acquisition time value stream 170, such that the selected acquisition time values $T_a$, $T_b$, $T_c$ . . . are a subset of the acquisition time values $T_1$, $T_2$, $T_3$, . . . of the acquisition time value stream 170.

For example, in one implementation $T_a=T_4$, $T_b=T_{254}$, $T_c=T_{504}$, and so on, depending on the occurrence of the predetermined times $t_1$, $t_2$, $t_3$ . . . referenced to the absolute time standard 111a with respect to the occurrence of the acquisition time values $T_1$, $T_2$, $T_3$, . . . of the acquisition time value stream 170.

Figure 5:
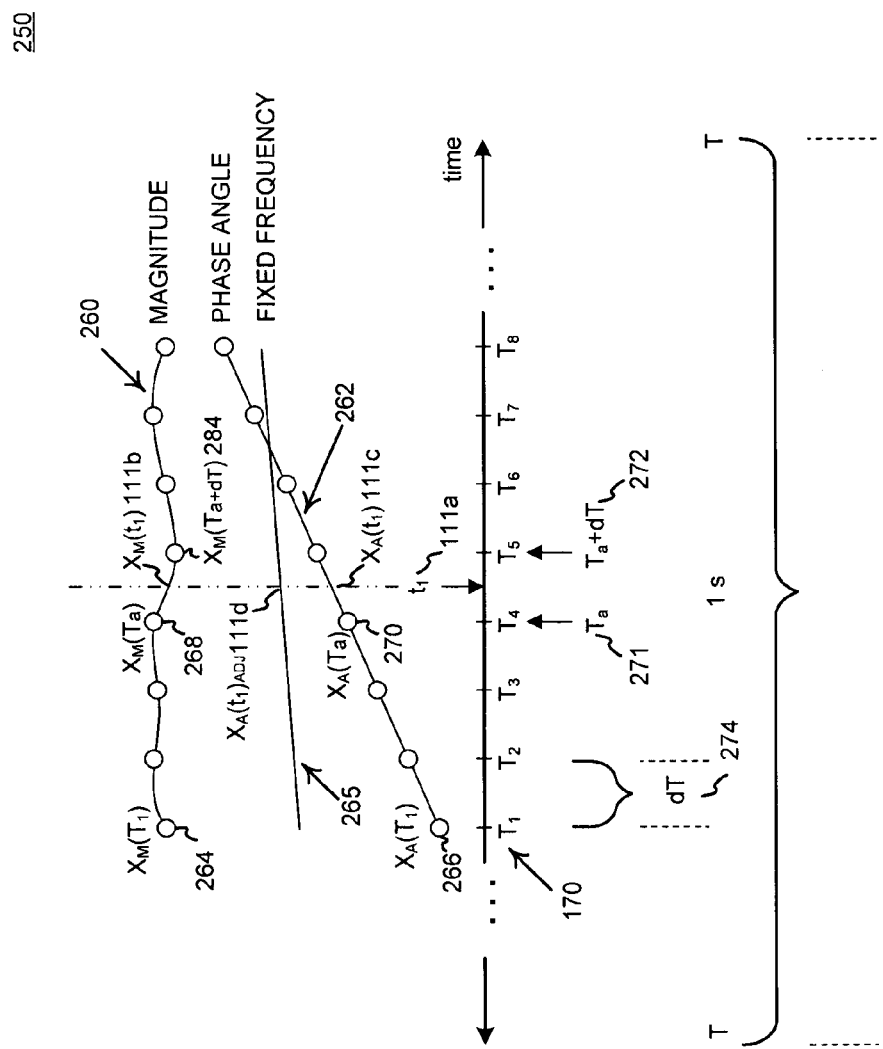
FIG. 5 is an exemplary timeline illustrating the relationship between the selected acquisition time values $T_a$, $T_b$, $T_c$ . . . , the acquisition time values $T_1$, $T_2$, $T_3$, . . . and the predetermined times $t_1$, $t_2$, $t_3$ . . . referenced to an absolute time standard of the phasor estimation of FIG. 4, according to an embodiment of the invention.

In summary, each of the selected acquisition time values $T_a$, $T_b$, $T_c$ . . . corresponds to one of the acquisition value $T_1$, $T_2$, $T_3$, . . . of the acquisition time value stream 170 that directly precedes an occurrence of one of the predetermined times $t_1$, $t_2$, $t_3$ . . . referenced to the absolute time standard 111a. FIG. 5 is an exemplary timeline 250 illustrating the relationship between the series of selected acquisition time values $T_a$, $T_b$, $T_c$ . . . , the acquisition time values $T_1$, $T_2$, $T_3$, . . . of the acquisition time value stream 170 and the predetermined times $t_1$, $t_2$, $t_3$ . . . referenced to the absolute time standard 111a of the phasor estimation 200. As shown in FIG. 5, the instantaneous time values T are selected to occur once every second, the predetermined times $t_1$, $t_2$, $t_3$ . . . referenced to the absolute time standard 111a are selected to occur every 250 ms and the acquisition time values $T_1$, $T_2$, $T_3$ . . . of the acquisition time value stream 170 occur approximately every 2 1/12 ms (based on 8 sampling instants per period of a local frequency of 60 Hz), however other time intervals are possible.

Recall that, each acquisition time value $T_1$, $T_2$, $T_3$, ... correlates to the control signal stream 162 which, in one embodiment, correlates to an integer multiple of the frequency of the input analog signal 102. Referring to FIG. 5, upon an occurrence of a predetermined time of the predetermined times $t_1$, $t_2$, $t_3$ ..., for example, the predetermined time $t_1$, an acquisition time value $T_1$, $T_2$, $T_3$, ... of the acquisition time value stream 170 immediately preceding the predetermined time $t_1$, for example, the acquisition time value $T_4$, is assigned a selected acquisition time value, for example $T_a$, and so on. In this example, the predetermined time $t_1$ and the selected acquisition time value $T_a$ form a corresponding time value pair $t_1$, $T_a$ of the time value pair stream 206. The corresponding time value pair, for example $t_1$, $T_a$, is then forwarded to the phasor adjustment block 214. Similarly, the corresponding time value pair $t_2$, $T_b$, the time value pair $t_3$, $T_c$ and so on are forwarded to the phasor adjustment block 214 as they are generated.

As discussed above, each acquisition time value $T_1$, $T_2$, $T_3$, ... of the acquisition time value stream 170 is associated with an instantaneous phasor magnitude 154a and an instantaneous phasor phase angle 154b. As a result of being derived from one acquisition time value $T_1$, $T_2$, $T_3$, ..., each of the selected acquisition time values $T_a$, $T_b$, $T_c$ ... correspond to one instantaneous phasor magnitude 154a and one instantaneous phasor phase angle 154b.

Referring again to FIG. 4, phasor adjustment block 214 is configured to adjust or realign the instantaneous phasor magnitude 154a and the instantaneous phasor phase angle 154b in order to generate the synchronized phasor 111, shown as referenced phasor magnitude stream 111b and referenced phasor phase angle stream 111c or 111d, suitable for use, for example, in the protection function 156. In general, the instantaneous phasor magnitude 154a and the instantaneous phasor phase angle 154b of the instantaneous phasor 154 occurring at the time of one of the acquisition time value $T_1$, $T_2$, $T_3$, ... is adjusted such that the resulting magnitude and phase angle are equal to a magnitude and phase angle of an equivalent phasor occurring at the time of the next occurring predetermined time $t_1$, $t_2$, $t_3$ ... referenced to an absolute time standard 111a. As noted above, the phase angle of the synchronized phasor 111 may further be referenced to a phasor of predetermined phase and frequency in order to compare to other similarly generated referenced phasors.

More specifically, the generate predetermined time function 202 generates an acquisition time value control signal 208 that operates to enable selected receipt of the instantaneous phasor magnitude 154a by an interpolate function of the phasor adjustment block 214, and to enable selected receipt of the instantaneous phasor phase angle 154b by a rotate block of the phasor adjustment block 214. Selected receipt is enabled upon an occurrence of each of the selected acquisition time values $T_a$, $T_b$, $T_c$ .... Although illustrated as causing a switching action, the acquisition time value control signal 208 may cause any suitable action that selectively enables the instantaneous phasor magnitude 154a and the instantaneous phasor phase angle 154b to be provided to the phasor adjustment block 214 upon an occurrence of a selected acquisition time value of the series of selected acquisition time values $T_a$, $T_b$, $T_c$ ....

Referring again to FIG. 5, a magnitude line 260 illustrates a series of instantaneous phasor magnitudes 154a (represented as dots) where each of the series of instantaneous phasor magnitudes 154a corresponds to an occurrence of an acquisition time value $T_1$, $T_2$, $T_3$, .... Similarly, a phase angle line 262 is aligned to the magnitude line 260 to illustrate a series of instantaneous phasor phase angle 154b (represented as dots) where each of the series of instantaneous phasor phase angles 154b corresponds to an occurrence of an acquisition time value. $T_1$, $T_2$, $T_3$, ....

For example, an instantaneous phasor magnitude 154a occurring at the acquisition time value $T_1$ is denoted as $X_M(T_1)$ 264 while an instantaneous phasor phase angle 154b occurring at the acquisition time value $T_1$ is denoted as $X_A(T_1)$ 266. Similarly, directly preceding the predetermined time $t_1$, an instantaneous phasor magnitude 154a occurring at the acquisition time value $T_4=T_a$ 271 is denoted as $X_M(T_a)$ 268 while an instantaneous phasor phase angle 154b occurring at the acquisition time value $T_4=T_a$ is denoted as $X_A(T_A)$ 270. It should be noted that in FIG. 5, the relationship of $T_4=T_a$ and $T_5=T_a+dT$ with respect to $t_1$ is used for illustrative purposes and that other alignments to $t_1$ are possible depending on the IED 100 implementation.

The synchronized phasor 111, derived at the predetermined time $t_1$, may be similarly illustrated in FIG. 5 as a referenced phasor magnitude $X_M(t_1)$ of a referenced phasor magnitude stream 111b denoted as $X_M(t_1, t_2, t_3, \ldots)$, and a referenced phasor phase angle $X_A(t_1)$ of a referenced phasor phase angle stream 111c denoted as $X_A(t_1, t_2, t_3, \ldots)$.

In one embodiment, the phase angles of the referenced phasor phase angle stream 111c are further processed to reference them to a phasor with predetermined phase and frequency. By subtracting a phase angle associated with fixed frequency reference phasor having a pre-selected reference frequency (e.g., 60.0 Hz) from each of the phase angles (e.g., for a system instantaneously at 60.2 Hz) of the referenced phasor phase angle stream 111c, the resulting phase angles are referenced to a phasor with predetermined phase and frequency to form an adjusted referenced phasor phase angle stream 111d. In other words, each referenced phasor phase angle can be further processed to remove a fixed frequency such that a resulting adjusted referenced phasor phase angle is estimated with respect to an associated time $t_1$, $t_2$, $t_3$ ... referenced to the absolute time standard 111a and a phasor with predetermined phase and frequency.

In the illustrated example of FIG. 5, a fixed frequency reference phasor line 265 is shown. Prior to referencing to a phasor with predetermined phase and frequency 265, a referenced phasor phase angle is located at the intersection of the phase angle line 262 and a bisecting line corresponding to the time value $t_1$, and is denoted as $X_A(t_1)$ 111c. Subsequent to referencing to a phasor with predetermined phase and frequency, the fixed frequency 265 is subtracted from the referenced phasor phase angle, resulting in an adjusted referenced phasor angle denoted as $X_A(t_1)_{ADJ}$ 111d. The subtraction is performed modulo the phase angle range of the referenced phasor phase angle 111c. For example, if the referenced phasor phase angle 111c is in range zero to 360 degrees, then the subtraction is computed modulo 360.

If the predetermined times $t_1$, $t_2$, $t_3$ ... referenced to the absolute time standard 111a are chosen appropriately to the time instants when the reference phasor with predetermined phase and frequency is at zero degrees, then the conversion to the phasor with predetermined phase and frequency is accomplished without further processing. This is due to the fact that the subtraction operation is always subtracting a value of zero and therefore does not need to be explicitly computed.

Figure 6A:
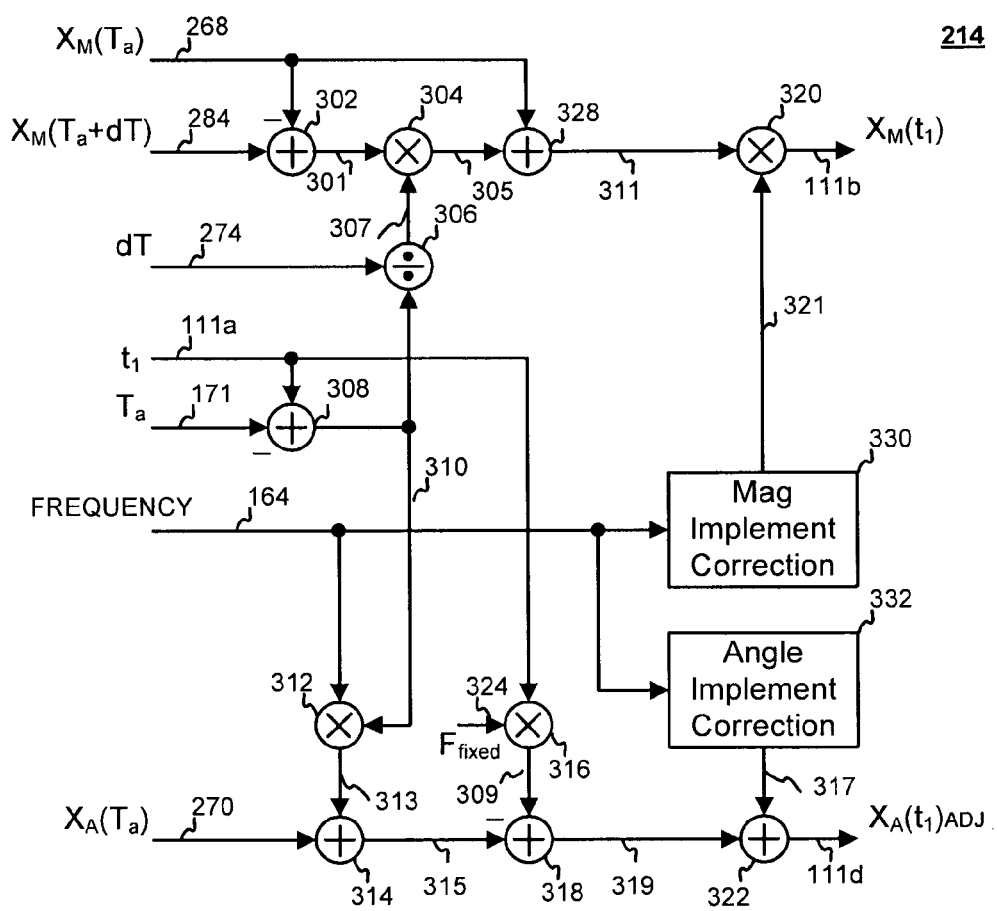
FIG. 6A is a functional block diagram of an exemplary phasor adjustment block of FIG. 4, according to an embodiment of the invention.

FIG. 6A is a functional block diagram of an exemplary phasor adjustment block 214, according to an embodiment of the invention. In the exemplary phasor adjusted block of FIG. 6A, each resulting synchronized phasor includes a predetermined time $t_1$, $t_2$, $t_3$ . . . referenced to the absolute time standard 111a, a referenced phasor magnitude of the referenced phasor magnitude stream 111b and an adjusted referenced phasor phase angle of the adjusted referenced phasor phase angle stream 111d. Although illustrated using a number of multipliers, adders, and operators as described below, it is contemplated that the phasor adjustment block 214 may be implement in one of any number of ways to provide interpolation of the instantaneous phasor magnitude 154a and rotation of the instantaneous phasor phase angle 154b to form the referenced phasor magnitude 111b and the referenced phasor phase angle 111c of the synchronized phasor 111.

Referring to FIGS. 5 and 6A, the phasor adjustment block 214 includes a first adder 302 configured to subtract the instantaneous phasor magnitude at the selected acquisition time value $X_M(T_a)$ 268 from the next instantaneous phasor magnitude at the selected acquisition time value $X_M(T_a+dT)$ 284 to generate a phasor magnitude difference 301, where $T_a+dT$ represents the time of the next acquisition time value following the selected acquisition time value $T_a$. Note that the selected acquisition time value $X_M(T_a+dT)$ 284 is simply available from the series of instantaneous phasor magnitudes 154a and does not imply anticausal processing. The phasor magnitude difference 301 represents a difference in the magnitude between two sequential instantaneous phasor magnitudes. The phasor adjustment block 214 also includes a second adder 308 configured to subtract the selected acquisition time value $T_a$ of the series of selected acquisition time values $T_a$, $T_b$, $T_c$ . . . from the predetermined time $t_1$ referenced to an absolute time standard 111a in order to generate a time value difference 310. The phasor adjustment block 214 further includes a divider 306 configured to divide the time value difference 310 by an acquisition time value delta dT 274 to generate a first proportionality factor 307. The time value difference 310 represents the difference in time from the selected acquisition time value $T_a$ 271 to the time value referenced to an absolute time standard $t_1$, and the acquisition time value delta dT 274 represents a time between the sampling instants of the control signal stream 162 provided by the sample controller 160. A first multiplier 304 is configured to multiply the phasor magnitude difference 301 by the first proportionality factor 307 to generate an intermediate magnitude difference signal 305.

The phasor adjustment block 214 further includes a third adder 328 configured to subtract the instantaneous phasor magnitude at the selected acquisition time value $X_M(T_a)$ 268 to the intermediate magnitude difference signal 305 to form an uncalibrated referenced phasor magnitude 311. A first operator 312 and a second operator 316 are also included in the phasor adjustment block 214. The first operator 312 is configured to multiply the local frequency 164 by the time value difference 310, followed by conversion from unity units to phase angle units by multiplication with a constant value representative of the conversion factor, to form a second proportionality factor 313. The second operator 316 is configured to multiply a fixed frequency 324 of the phasor with predetermined phase and frequency by the predetermined time value $t_1$ referenced to an absolute time standard 111a, followed similarly by unit conversion to generate a third proportionality factor 309. The second operator 316 uses the fact that phase values remain within a fixed range (e.g. zero to 360 degrees) to convert the predetermined time value $t_1$ referenced to an absolute time standard 111a to a small range of values prior to multiplication. For example, if the phasor with predetermined phase and frequency is chosen such that the phase is always equal to zero at each exact multiple of one second, according to the absolute time standard, then the predetermined time value $t_1$ referenced to an absolute time standard 111a can be converted to a range of zero to one second prior to multiplication by fixed frequency 324. To convert the range for this example, simply remove the rest of the time information, according to the representation of the predetermined time value $t_1$ referenced to an absolute time standard 111a, for example the year, day, hours, and minutes information can be removed, along with subtracting an integer number of seconds from the predetermined time value $t_1$ referenced to an absolute time standard 111a so that the resulting range is zero to one second.

The phasor adjustment block 214 also includes a third and a fourth operator 314 and 318, where the third operator 314 is configured to add the instantaneous phasor phase angle at the selected acquisition time value $X_A(T_a)$ 270 to the second proportionality factor 313, followed by modulo conversion to the desired phase angle range, to form a pre-aligned referenced phasor 315. The fourth operator 318 is configured to add the pre-aligned referenced phasor 315 to the third proportionality factor 309, followed by modulo conversion to the desired phase angle range to form an adjusted uncalibrated referenced phasor phase angle 319.

Implementation magnitude distortion can be approximated and removed via a Mag Implement Correction 330 configured to receive the local frequency 164 and remove any implementation distortion to form a magnitude correction factor 321 using one of a number of techniques. Such implementation distortion may be introduced via IED components such as the analog filter 140 distorting the filtered analog instantaneous signal 142 with gain compression as a function of the local frequency. This is because each filter has a specific magnitude and phase response which varies as a function of the frequency content of the signal upon which it acts. It is not the purpose of Mag Implement Correction 330 to correct for off-nominal sampling errors. This is because the invention samples as a function of the varying frequency of the local signal (e.g. input analog signal 102) and therefore does not require corrections to compensate for sampling at a rate different than the local signal, such as fixed rates or rates based on the absolute time reference. One technique that may be employed by the Mag Implement Correction 330 includes use of a look-up table containing the distortion compensating values as a function of the instantaneous phasor magnitude 154a. Furthermore, the compensation can be included with the interpolation operation by further adjusting the time value referenced to an absolute time standard according to the amount of effective time shift required to compensate for phase shifts of the, for example, analog filter 140.

Similarly, phase angle distortion or shift can be approximated and removed via an Angle Implement Correction 332 configured to receive the local frequency 164 and remove any implementation distortion to form a phase correction factor 317, using one of a number of techniques. Such implementation distortion may be caused by phase shifts introduced by IED components such as the analog filter 140. It is not the purpose of Angle Implement Correction 332 to correct for off-nominal sampling errors. This is because the invention samples as a function of the varying frequency of the local signal (e.g. input analog signal 102) and therefore does not require corrections to compensate for sampling at a rate different than the local signal, such as fixed rates or rates based on the absolute time reference. One technique that may be employed by the Angle Implement Correction 332 includes use of a pre-selected constant or a parameter such as a look-up table containing the distortion compensating values as a function of the instantaneous phasor magnitude 154a.

A second multiplier of the phasor adjustment block 214 is configured to multiply the uncalibrated referenced phasor magnitude 311 with the magnitude correction factor 321 to form the referenced phasor magnitude $X_M(t_1)$ of the referenced phasor magnitude stream 111b. Similarly, a fifth operator 322 of the phasor adjustment block 214 is configured to add the adjusted uncalibrated referenced phasor phase angle 319 to the phase correction factor 317 to form the adjusted referenced phasor phase angle $X_M(t_1)_{ADJ}$ of the adjusted referenced phasor phase angle stream 111d. In this way, synchronized phasors 111 are estimated at predetermined times referenced to the absolute time standard in an electrical system and referenced to a phasor with predetermined phase and frequency.

In an alternate embodiment, the Phasor Estimation 200 can use selected acquisition time values $T_a$, $T_b$, $T_c$, . . . which correspond to existing sample instants that immediately precede an associated predetermined time $t_1$, $t_2$, $t_3$ . . . referenced to an absolute time standard 111a in conjunction with the time next time values $T_a+dT$, $T_b+dT$, $T+dT_c$ . . . (immediately subsequent to a predetermined time $t_1$, $t_2$, $t_3$ . . . referenced to an absolute time standard 111a) to interpolate the instantaneous phasor phase angle 154b to form the referenced phasor phase angle of the referenced phasor phase angle stream 111c, in a manner equivalent to the interpolation shown in FIG. 6A for the referenced phasor magnitude of the referenced phasor magnitude stream 111b. Whereas the rotation of the instantaneous phasor phase angle 154b of the above embodiment takes advantage of the known slope of phase change as a function of the local frequency 164, the alternate embodiment interpolation utilizes the instantaneous phasor phase angle 154b sampled on either side of a predetermined time, for example $t_1$, to determine the referenced phasor phase angle of the referenced phasor phase angle stream 111c (see FIG. 5).

In the alternate embodiment, a representation of the phasors as complex real and imaginary components can be similarly converted from the selected acquisition time values $T_a$, $T_b$, $T_c$ . . . to predetermined times $t_1$, $t_2$, $t_3$ . . . referenced to the absolute time standard 111a in a manner equivalent to the interpolation shown in FIG. 6A for each referenced phasor magnitude of the referenced phasor magnitude stream 111b. In this case, referencing to a phasor with predetermined phase and frequency of the phase angles is performed in a manner shown by the second operator 316 and the fourth operator 318 of FIG. 6A if the phasor is characterized as having a magnitude and phase angle. For phasors characterized as having a complex real and imaginary part, complex multiplication of the phasor by the phasor with predetermined phase and frequency is sufficient to convert a referenced phasor phase angle of the referenced phasor phase angle stream 111c to an adjusted referenced phasor phase angle of the adjusted referenced phasor phase angle stream 111d.

Figure 6B:
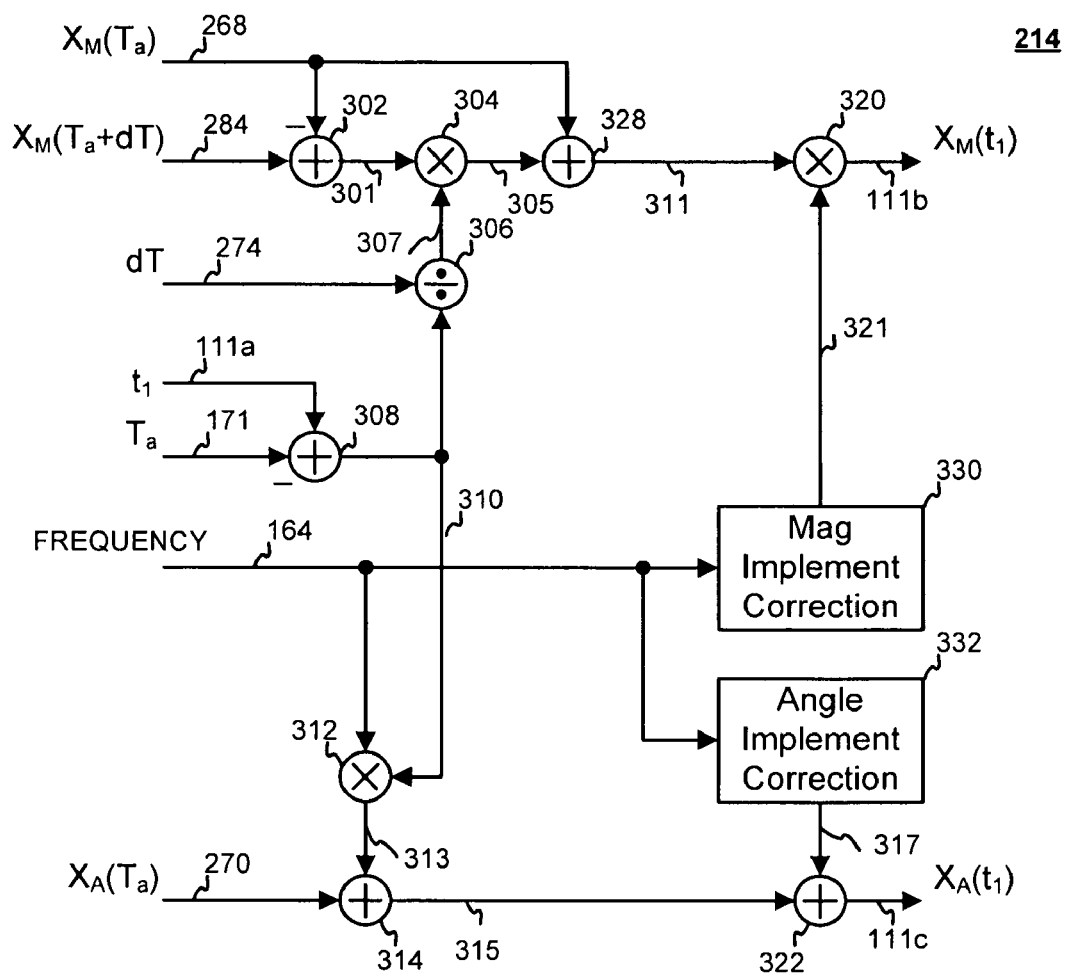
FIG. 6B is a functional block diagram of another exemplary phasor adjustment block of FIG. 4, according to an embodiment of the invention.

FIG. 6B is a functional block diagram of another exemplary phasor adjustment block 214, according to an embodiment of the invention. In the exemplary phasor adjusted block of FIG. 6B, referencing to a phasor with predetermined phase and frequency is not performed such that each resulting synchronized phasor includes a predetermined time $t_1$, $t_2$, $t_3$ . . . referenced to an absolute time standard 111a, a referenced phasor magnitude of the referenced phasor magnitude stream 111b and a referenced phasor phase angle of the referenced phasor phase angle stream 111c. The exemplary phasor block of FIG. 6B is configured and operational as described in FIG. 6A, except it excludes the second operator to multiply a fixed frequency by the time value referenced to the absolute time standard. As a result, the referenced phasor phase angle stream 111c is generated rather than the adjusted referenced phasor phase angle stream 111d.

Figure 7:
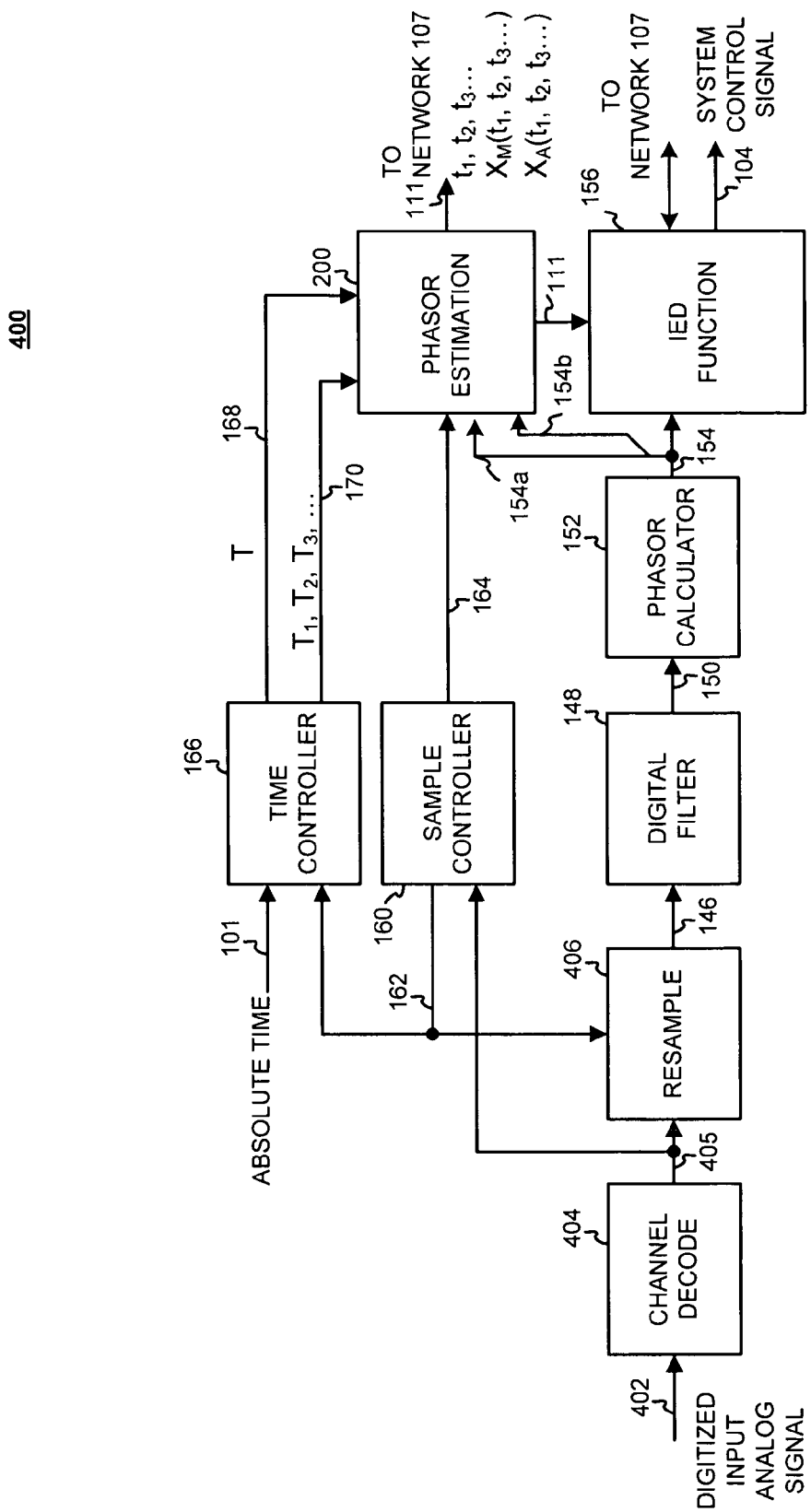
FIG. 7 is a functional block diagram of another IED of FIG. 1 that may be used in conjunction with remote acquisition devices, according to an embodiment of the invention.

FIG. 7 is a functional block diagram of another IED 400 that may be used in conjunction with one or more remote devices, according to an embodiment of the invention. In this case, the remote device (not separately illustrated) converts its input analog signal 102 into a digital format suitable for transmission to the IED 400. A digitized input analog signal 402 is therefore received by the IED 400.

Referring to FIG. 7, rather than the analog filter 140 and the ADC 144 of the IED 100, the IED 400 includes a channel decode 404 configured to decode the digitized input analog signal 402 received from another IED, and a resample block 406. The digitized input analog signal 402 may be received via one of any number of mediums including wired and wireless. The digitized input analog signal 402 may be encoded using well-known methods to ensure transmission security, reduce unwanted effects of noise, reduce multipath signal interference and burst errors, and the like, and may be decoded using one of any number of well-known suitable formats, depending on the IED implementation and/or the encoding scheme.

When received by the channel decode 404, the digitized input analog signal 402 is decoded to form a decoded instantaneous signal 405. The decoded instantaneous signal 405 includes the instantaneous amplitude of the remote analog input signal as well as information regarding a remote data acquisition time value. The remote data acquisition time value indicates an instant at which the power system signal was sampled by the remote device to acquire its analog input signal, where the sampling instant is referenced to an absolute time standard (e.g., UTC). The decoded instantaneous signal 405 may further include additional data such as a power system frequency measured by the remote device (remote frequency), although such frequency information may be derived by the IED 400 from the instantaneous amplitude of the decoded instantaneous signal 405 and the remote data acquisition timestamp, using well-known methods.

The resample block 406 is configured to generate signal samples representative of the input analog signal 102 received by the remote device. Thus, upon receipt by the resample block 406, the decoded instantaneous signal 405 is adjusted from the remote sampling interval to an interval which is representative of the remote frequency. As a result, the sampled analog instantaneous signal 146 (representative of the input analog signal 102 received by the remote device) is provided to the digital filter 148. The remaining components (e.g., sample controller 160) of FIG. 7 are substantially configured and operable as described in connection with FIGS. 3-6 to provide synchronized phasors 111 indication of the power system 10 referenced to the absolute time instants.

Figure 8:
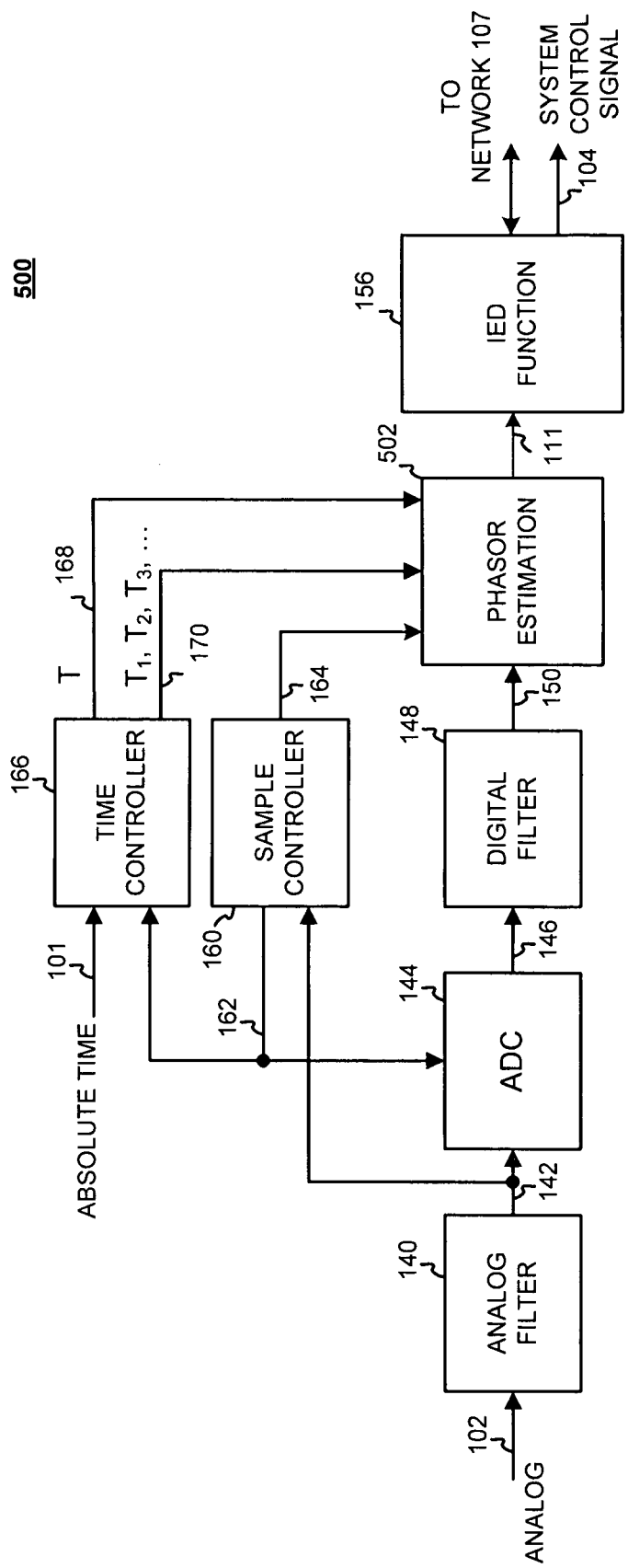
FIG. 8 is a functional block diagram of yet another IED of FIG. 1, according to an embodiment of the invention.

FIG. 8 is a functional block diagram of yet another IED 500, according to an embodiment of the invention. In this case, the IED 500 converts the input analog signal 102 to synchronized phasors 111 prior to performing the appropriate protection, automation, control, metering function by the IED function 156 to determine the status of the power system 10. In summary, rather than providing the series of instantaneous phasors 154 from the magnitude and phase angle calculator, along with synchronized phasors 111 from the phasor estimation 200, to the IED function 156 as shown in FIG. 3, the IED 500 includes a phasor estimation 502 coupled to the IED function 156 such that the synchronized phasors 111 are first calculated and then forwarded for use by the IED function 156.

Like the IED of FIG. 3, the IED 500 includes the analog filter 140, the ADC 144, the digital filter 148, the sample controller 160 and the time controller 166, operating as described in connection with FIGS. 3-6. Unlike the IED of FIG. 3 however, the phasor estimation 502 of the IED 500 includes the functionality of the phase calculator 152 (without the 90 degree phase shift functionality), and utilizes a separate 90 degree shift in conjunction with an interpolation to adjust the phase angle of the filtered signal 150 and form the referenced phasor magnitude stream 111b and the referenced phasor phase angle stream 111c and/or the adjusted referenced phasor phase angle stream 111d of the synchronized phasors 111.

Figure 9:
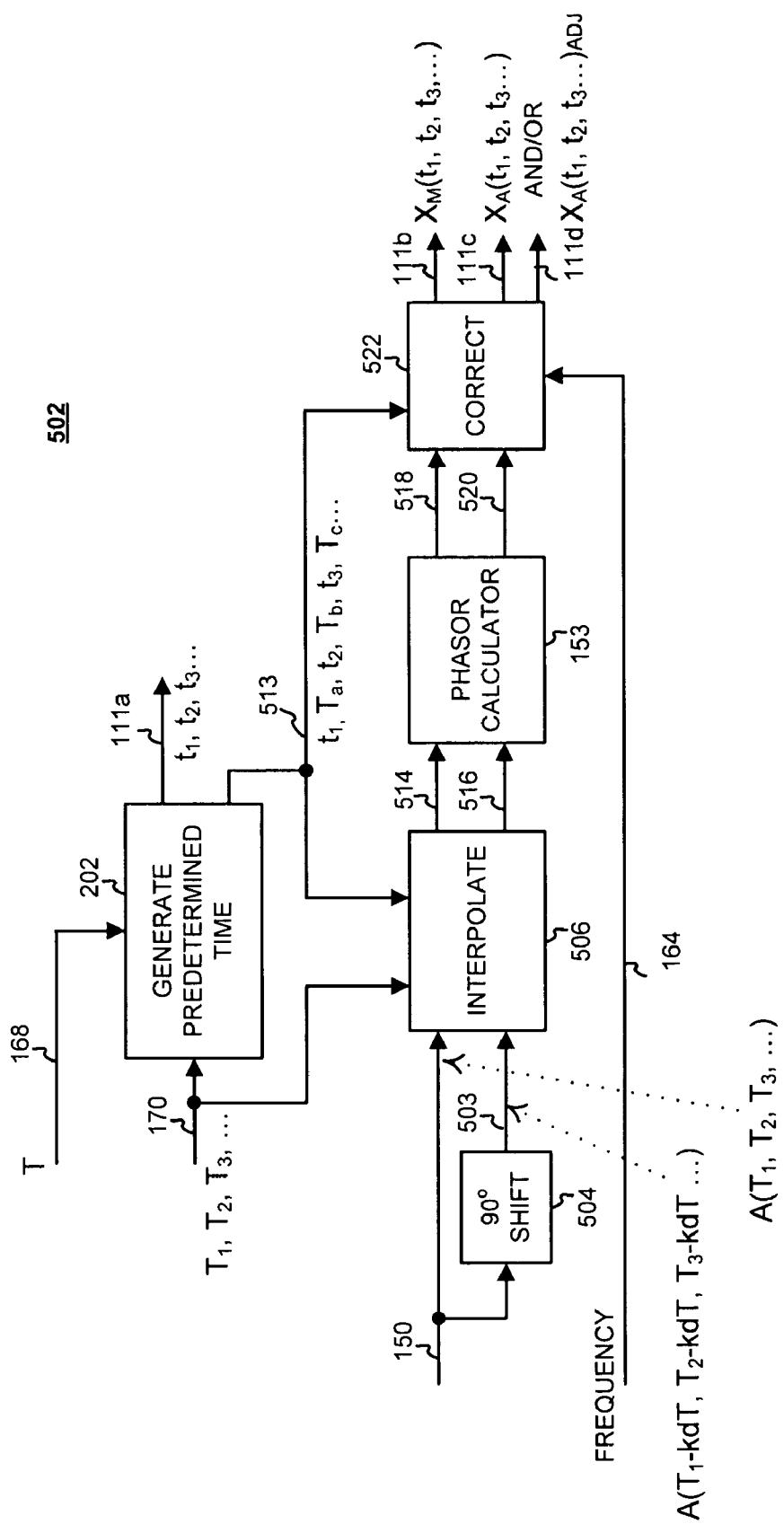
FIG. 9 is a functional block diagram of a phasor estimation of FIG. 8, according to an embodiment of the invention.

FIG. 9 is a functional block diagram of the phasor estimation 502 of the IED 500, according to an embodiment of the invention. The phasor estimation 502 includes a 90 degree shift block 504 having an input for receiving the filtered signal 150. The filtered signal 150 is representative of the input analog signal 102 and is generated in response to the sampling instants of the control signal stream 162. The filtered signal 150 may therefore be denoted as $A(T_1, T_2, T_3, \ldots)$ where each of $T_1, T_2, T_3, \ldots$ is an acquisition time value of a corresponding sample of the filtered signal 150, and where A is an instantaneous amplitude.

Upon receipt of the filtered signal 150, the 90 degree shift block 504 operates to shift the filtered signal 150 by 90 degrees to form a shifted filtered signal 503. The 90 degree shift may be accomplished by delaying each of the samples forming the filtered signal 150 by ¼ cycle, according to the local frequency 164. In one embodiment, the samples of the filtered signal are taken at an integer multiple sixteen times the local frequency 164. The shifted filtered signal 503 may be denoted as $A(T_1-kdT, T_2-kdT, T_3-kdT, \ldots)$ where each of the samples of the filtered signal 150 is delayed by kdT, where k equals an integer value equal to ¼ of the total number of samples of the filtered signal 150 included in a single analog waveform period T, in this case k=4, and where dT equals a time period between each sample of the filtered signal 150.

Figure 10:
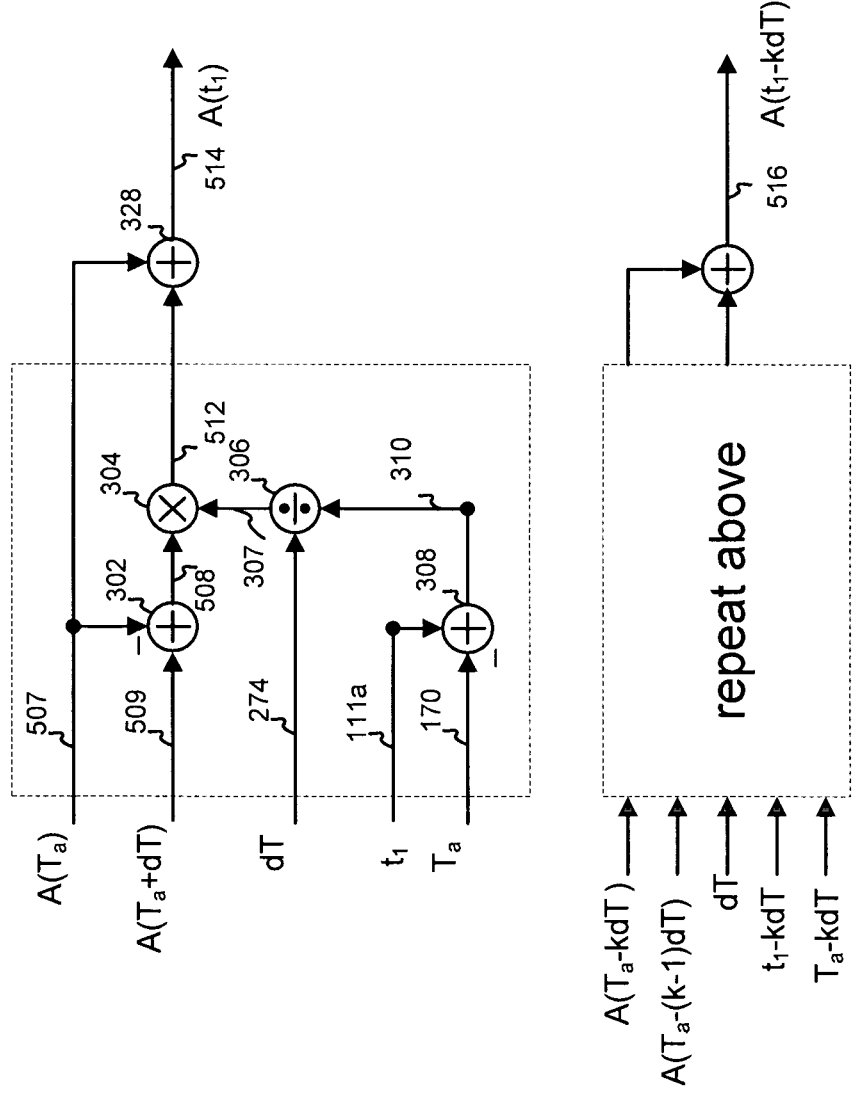
FIG. 10 is a functional block diagram of an exemplary interpolate block of the phasor estimation of FIG. 9, according to an embodiment of the invention.

The phasor estimation 502 also includes an interpolate block 506 having a first input for receiving the filtered signal 150, having a second input for receiving the shifted filtered signal 503, having a third input for receiving the acquisition time values $T_1, T_2, T_3, \ldots$ of the acquisition time value stream 170, and having a fourth input for receiving time value pair stream 513, which includes the predetermined times $t_1, t_2, t_3 \ldots$ referenced to the absolute time standard 111a along with the selected acquisition time values $T_a, T_b, T_c, \ldots$. The interpolate block 506 is configured to adjust the time of each of the samples of the filtered signal 150 and shifted filtered signal 503 from an acquisition time value such as $T_a=T_4$ to a time value referenced to the absolute time standard such as the predetermined time value $t_1$ occurring between two of the acquisition time values such as $T_4$ and $T_5$ For example, FIG. 10 is a functional block diagram of one example of the interpolate block 506 of the phasor estimation 502, according to an embodiment of the invention. Although illustrated using a number of multipliers, adders, and operators as described below, it is contemplated that the interpolate block 502 may be implemented in one of any number of ways to provide adjustment from the remote sampling interval to the interval which is representative of the remote frequency.

Referring to FIG. 10, the interpolate block 506 includes the first adder 302 configured to subtract a first sample 507 of the filtered signal 150 taken at a selected acquisition time value such as $T_a=T_4$ from a corresponding next sample 509 of the filtered signal 150 taken at a an acquisition time value such as $T_5$ to generate a sample amplitude difference 508. The sample amplitude difference 508 represents a difference in the amplitude between two sequential instantaneous sample magnitudes of the filtered signal 150. The interpolate block 506 also includes the second adder 308 configured to subtract a selected acquisition time value of the selected acquisition time value stream 170, for example, $T_a$ from a predetermined time referenced to an absolute time standard 111a, for example $t_1$, to generate the time value difference 310.

Further, the divider 306 of FIG. 10 is configured to divide the time value difference 310 by the acquisition time value delta dT 274 to generate the first proportionality factor 307 (see, FIGS. 5 and 6). In the illustrated example, the time value difference 310 represents a difference in time between the selected acquisition time value $T_a$ to the predetermined time $t_1$ referenced to the absolute time standard 111a, and the acquisition time value delta dT 274 represents a time between the sampling instants of the control signal stream 162. The first multiplier 304 is configured to multiply the sample amplitude difference 508 by the first proportionality factor 307 to generate an intermediate amplitude difference signal 512.

The interpolate block 506 further includes the third adder 328 configured to add the first sample 507 of the filtered signal 150 to the intermediate amplitude difference signal 512 to form an uncalibrated referenced sample amplitude $A(t_1)$ 514. Although not separately illustrated, a shifted uncalibrated referenced sample amplitude $A(t_1-kdT)$ 516 is equivalently formed via the interpolation block 506. The implementation of −kdT can be simply selecting a value that is k samples previous to the present value.

Referring again to FIG. 9, each of the uncalibrated referenced sample amplitudes 514, for example $A(t_1)$, and each of the shifted uncalibrated referenced sample amplitudes 516, for example $A(t_1-kdT)$, are received by a phasor calculator 153. The phasor calculator 153 is configured to calculate a series of uncalibrated referenced phasor magnitudes 518 from the uncalibrated referenced sample amplitudes 514 and the shifted uncalibrated referenced sample amplitudes 516. Similarly, the phasor calculator 153 is configured to calculate a corresponding series of prealigned referenced phasor phase angles 520 from the uncalibrated referenced sample amplitudes 514 and the shifted uncalibrated referenced sample amplitudes 516. Accordingly, each uncalibrated referenced phasor magnitude 518 has a corresponding prealigned referenced phasor phase angle 520. The details of calculating a phasor magnitude and angle representation from a real and imaginary representation is well known, and furthermore can include the well known calculation of sequence quantities such as positive sequence, negative sequence, and zero sequence. In FIG. 9 the real component is represented by the uncalibrated referenced sample amplitude 514 and the imaginary component is represented by the shifted uncalibrated referenced sample amplitudes 516.

The phasor estimation 502 also includes a correct block 522 configured to remove implementation artifacts and distortion from the uncalibrated referenced phasor magnitudes 518 and the prealigned referenced phasor phase angles 520 to form corresponding referenced phasor magnitudes of the referenced phasor magnitude stream 111b and referenced phasor phase angles of the referenced phasor phase angles stream 111c, and/or to form corresponding adjusted referenced phasor magnitudes of the referenced phasor magnitude stream 111b and corresponding adjusted referenced phasor phase angles of the adjusted referenced phasor phase angles stream 111d.

Figure 11:
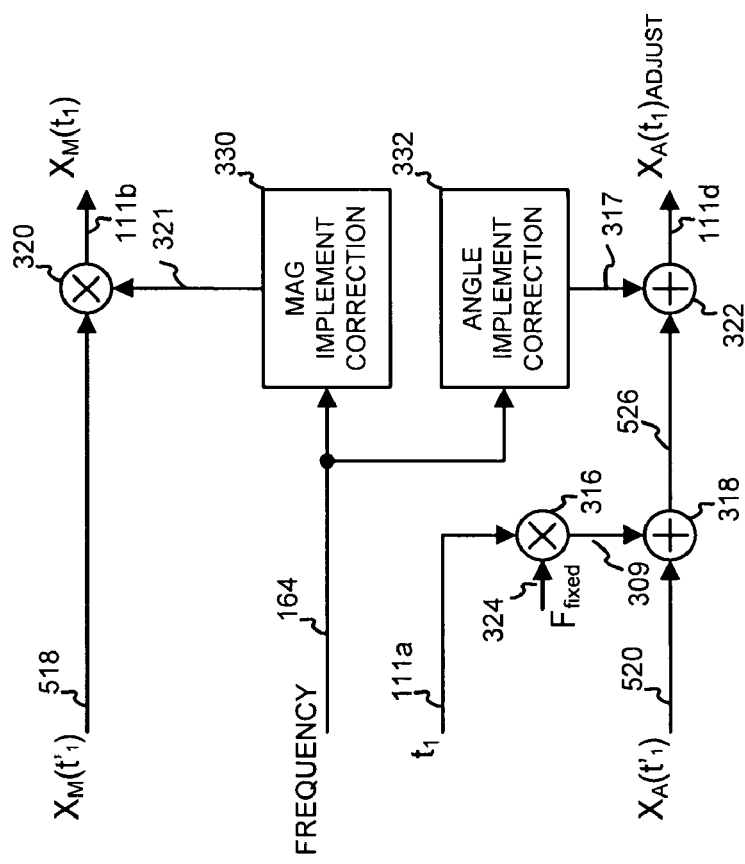
FIG. 11 is a functional block diagram of a correct block of FIG. 8, according to an embodiment of the invention.

FIG. 11 is a functional block diagram of an exemplary correct block 522, according to an embodiment of the invention. In the exemplary correct block 522 of FIG. 11, referencing to a phasor with predetermined phase and frequency is performed such that each resulting referenced phasor includes a referenced phasor magnitude of the referenced phasor magnitude stream 111b and an adjusted referenced phasor phase angle of the adjusted referenced phasor phase angle stream 111d, at a predetermined time $t_1$, $t_2$, $t_3$ . . . referenced to an absolute time standard 111a. It is contemplated however, that like the phasor adjustment block of FIG. 6A, referencing to a phasor with predetermined phase and frequency is not necessarily performed in the exemplary correct block 522 of FIG. 11 such that each resulting referenced phasor includes a referenced phasor magnitude of the referenced phasor magnitude stream 111b and a referenced phasor phase angle of the referenced phasor phase angle stream 111c at a predetermined time $t_1$, $t_2$, $t_3$ . . . referenced to an absolute time standard 111a.

As illustrated, the correct block 522 includes a first input for receiving the uncalibrated referenced phasor magnitude 518, a second input for receiving the local frequency 164, a third input for receiving the predetermined time value stream 111a, and a fourth input for receiving the prealigned referenced phasor phase angle 520. The correct block 522 also includes the second operator 316 configured to multiply the reference frequency 324 of the fixed frequency reference phasor by a time value of the predetermined time value stream 111a, for example, the time value $t_1$, followed similarly by unit conversion, to generate the third proportionality factor 309. The correct block 522 further includes the fourth operator 318 configured to add the prealigned referenced phasor phase angle 520 to the third proportionality factor 309, followed by modulo conversion to the desired phase angle range to form an uncalibrated referenced phasor phase angle 526.

Implementation magnitude distortion can be approximated and removed via the Mag Implement Correction 330 configured to receive the local frequency 164 and remove any implementation distortion to form the magnitude correction factor 321 using one of a number of techniques as described in connection with FIGS. 6A and B. Similarly, implementation phase angle distortion or shift can be approximated and removed via the Angle Implement Correction 332 configured to receive the local frequency 164 and remove any implementation distortion to form the angle correction factor 317 using one of a number of techniques as described in connection with FIGS. 6A and B. It is not the purpose of Mag Implement Correction 330 or Angle Implement Correction 332 to correct for off-nominal sampling errors. This is because the invention samples as a function of the varying frequency of the local signal (e.g. input analog signal 102) and therefore does not require corrections to compensate for sampling at a rate different than the local signal, such as fixed rates or rates based on the absolute time reference.

The second multiplier 320 of the correct block 522 is configured to multiply the uncalibrated referenced phasor magnitude 518 with the magnitude correction factor 321 to form the referenced phasor magnitudes of the referenced phasor magnitude stream 111b. Similarly, the fifth operator 322 of the correct block 522 is configured to add the uncalibrated referenced phasor phase angle 526 to the angle correction factor 317 to form the referenced phasor phase angles of the referenced phasor phase angle stream 111d. In this way, referenced phasors are accurately estimated at time values referenced to an absolute time standard in an electrical system. The uncalibrated referenced phasor magnitude 518 and the prealigned referenced phasor phase angle 520 may be representative of values at times slightly different than the predetermined time $t_1$, $t_2$, $t_3$ . . . referenced to an absolute time standard 111a and this difference is corrected by the magnitude correction factor 321 and the phase correction factor 317. In some cases the uncalibrated referenced phasor magnitude 518 can be corrected by an interpolation step in place of the second multiplier 320.

The present method may be implemented as a computer process, a computing system or as an article of manufacture such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process.

Figure 12:
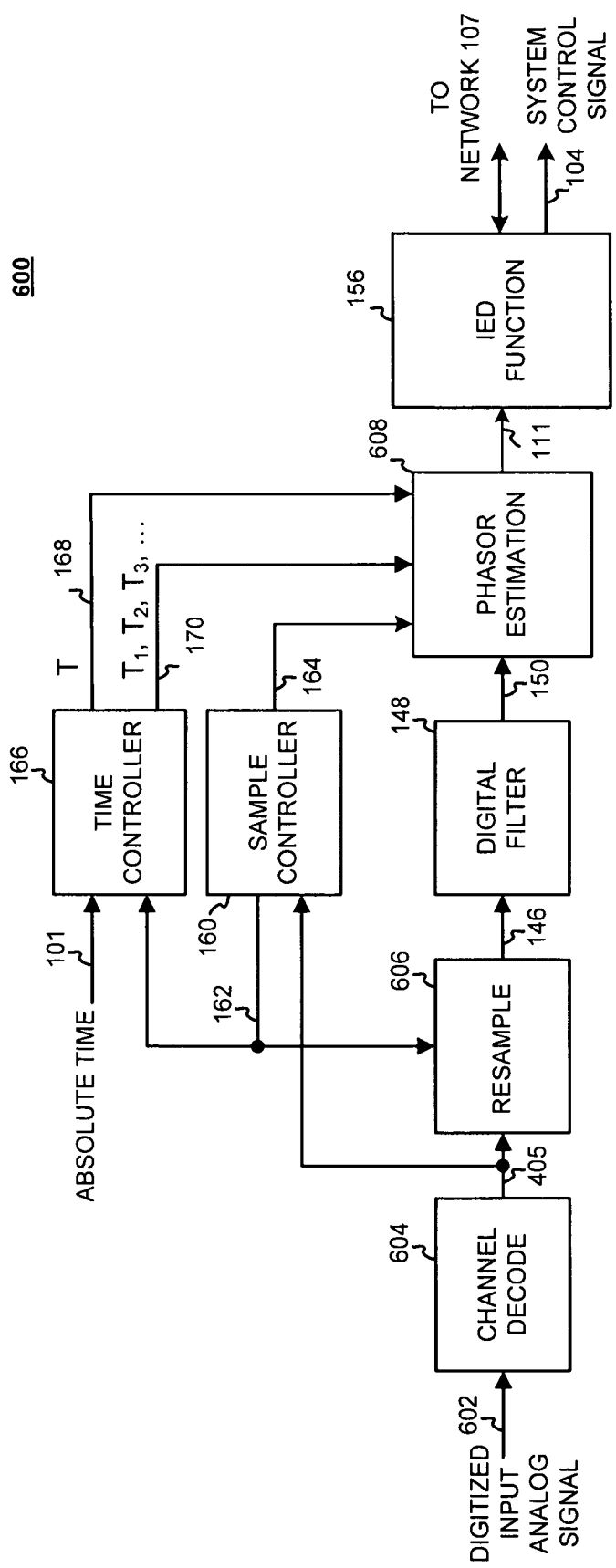
FIG. 12 is a functional block diagram of yet another IED of FIG. 1, according to an embodiment of the invention.

FIG. 12 is a functional block diagram of yet another IED 600 that may be used in conjunction with one or more remote devices, according to an embodiment of the invention. In this case, the remote device (not separately illustrated) converts its input analog signal 102 into a digital format suitable for transmission to the IED 600. A digitized input analog signal 602 is therefore received by the IED 600.

Rather than the analog filter 140 and the ADC 144 of the IED 100, the IED 400 includes channel decode block 604 configured to decode the digitized input analog signal 602 received from a remote IED, and a resample block 406. The digitized input analog signal 602 may be received via one of any number of mediums including wired and wireless. The digitized input analog signal 602 may be encoded using well-known methods to ensure transmission security, reduce unwanted effects of noise, reduce multipath signal interference and burst errors, and the like, and may be decoded using one of any number of well-known suitable formats, depending on the IED implementation and/or the encoding scheme.

When received by the channel decode block 604, the digitized input analog signal 602 is decoded to form a decoded instantaneous signal 405. The decoded instantaneous signal 405 includes the instantaneous amplitude of the remote analog input signal as well as information regarding a remote data acquisition time value. The remote data acquisition time value indicates an instant at which the power system signal was sampled by the remote device to acquire its analog input signal, where the sampling instant is referenced to an absolute time standard (e.g., UTC). The decoded instantaneous signal 405 may further include additional data such as power system frequency measured by the remote device (remote frequency), although such frequency information may be derived by the IED 400 from the instantaneous amplitude of the decoded instantaneous signal 405 and the remote data acquisition timestamp, using well-known methods.

The resample block 606 is configured to generate signal samples representative of the input analog signal 602 received by the remote device. Thus, upon receipt by the resample block 606, the decoded instantaneous signal 405 is adjusted from the remote sampling interval to an interval which is representative of the remote frequency. As a result, the sampled analog instantaneous signal 146 (representative of the input analog signal 602 received by the remote device) is provided to the digital filter 148. The remaining components (e.g., sample controller 160) of FIG. 12 are substantially configured and operable as described in connection with FIG. 8 to provide synchronized phasors 111 indication of the power system 10 referenced to the absolute time instants.

In one embodiment, the logical operations of the present method are implemented (1) as a sequence of computer implemented acts or program modules running on a computing system and/or (2) as interconnected machine logic circuits or circuit modules within the computing system. The implementation is a matter of choice dependent on the performance requirements of the computing system implementing the invention. Accordingly, the logical operations making up the embodiments of the present invention described herein are referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

What is claimed is:

1. An apparatus for estimating a plurality of synchronized phasors at predetermined times referenced to an absolute time standard in an electrical power system, the apparatus comprising:
   a sample controller configured to determine a frequency of a power system signal acquired at a location of the electrical power system;
   a sampling means configured to sample the electrical power system signal at a sampling interval rate based on the frequency of the power system signal to form a plurality of signal samples;
   a time controller configured to generate a plurality of acquisition time values based on an occurrence of each of the plurality signal samples at a corresponding plurality of sample times referenced to the absolute time standard, each of the plurality of acquisition time values associated with a phasor magnitude and a phasor phase angle of each of the plurality of signal samples; and
   a phasor estimator configured to adjust the phasor magnitude and the phasor phase angle for each of the plurality of signal samples based on a time difference between a corresponding selected acquisition time value of the plurality of acquisition time values and a predetermined time of the predetermined times referenced to the absolute time standard to form the plurality of synchronized phasors.

2. The apparatus of claim 1, wherein each of the plurality of synchronized phasors comprises a corresponding plurality of referenced phasor magnitudes and referenced phasor phase angles.

3. The apparatus of claim 2, wherein the phasor estimator is further configured to:
   interpolate each of the plurality of phasor magnitudes to form each of the plurality of referenced phasor magnitudes; and
   rotate each of the plurality of phasor phase angles to form each of the plurality of referenced phasor phase angles.

4. The apparatus of claim 2, further comprising a digital filter to generate a plurality of filtered signals, wherein the phasor estimator is further configured to phase shift each of the plurality of filtered signals by 90 degrees and interpolate prior to calculating reference phasor magnitudes and referenced phasor phase angles.

5. The apparatus of claim 2, further comprising a phasor calculator configured to calculate an uncalibrated referenced phasor magnitude and a prealigned referenced phasor phase angle of each of the plurality of signal samples at the plurality of acquisition time values prior to adjusting the phasor magnitude and the phasor phase angle to the corresponding plurality of referenced phasor magnitudes and referenced phasor phase angles.

6. The apparatus of claim 1, wherein the time difference comprises a difference in time between an occurrence of a preceding selected acquisition time value of the plurality of acquisition time values and a predetermined time of the predetermined times referenced to the absolute time standard.

7. The apparatus of claim 1, wherein the time difference comprises a difference in time between an occurrence of a predetermined time of the predetermined times referenced to the absolute time standard and a next selected acquisition time value of the plurality of acquisition time values.

8. The apparatus of claim 1, wherein the predetermined times are synchronized across the electrical power system.

9. The apparatus of claim 1, wherein the predetermined times are determined local to the apparatus.

10. The apparatus of claim 1, wherein the phasor estimator is further configured to phase align each of the plurality of synchronized phasors to a reference phasor with a predetermined phase and frequency.

11. The apparatus of claim 10, wherein the predetermined frequency comprises 60 Hz.

12. The apparatus of claim 10, wherein the predetermined frequency comprises 50 Hz.

13. The apparatus of claim 1, wherein the power system signal comprises a plurality of power system signals.

14. The apparatus of claim 1, further comprising an analog filter configured to filter the power system signal prior to receipt by the sampling means.

15. The apparatus of claim 1, wherein the absolute time standard is based on a global positioning system signal communicated via an IRIG timecode protocol.

16. The apparatus of claim 1, further comprising a digital filter configured to digitally filter each of the plurality of signal samples.

17. The apparatus of claim 1, wherein the sampling interval rate is an integer multiple of the frequency of the power system signal.

18. The apparatus of claim 1, further comprising utilizing one or more of the plurality of synchronized phasors to perform a power system function selected from the group consisting of: protection; automation; metering; control; and combinations thereof.

19. The apparatus of claim 1, wherein the sample controller is further configured to generate a sample frequency signal based on the sampling interval rate, the sample frequency signal aligned with the plurality of acquisition time values and utilized to form the plurality of synchronized phasors.

20. The apparatus of claim 2, wherein the phasor estimator is further configured to:
   remove implementation magnitude distortion from the sample frequency signal prior to forming each of the plurality of synchronized phasors; and
   remove implementation phase angle distortion from the sample frequency signal prior to forming each of the plurality of synchronized phasors.

21. The apparatus of claim 1, wherein the location of the power system signal is local and the power system signal comprises a local analog input signal.

22. The apparatus of claim 1, wherein the location of the power system signal is remote and the power system signal comprises a digitized remote analog input signal.

23. The apparatus of claim 1, wherein each of the plurality of synchronized phasors comprises a corresponding plurality of referenced phasor sequence quantities.

24. A method for estimating a plurality of synchronized phasors at predetermined times referenced to an absolute time standard in an electrical power system, the method comprising:
   determining a frequency of a power system signal;
   sampling the power system signal at a sampling interval rate based on the frequency of the power system signal to form a plurality of signal samples;
   generating a plurality of acquisition time values based on an occurrence of each of the plurality signal samples at a corresponding plurality of sample times referenced to the absolute time standard, each of the plurality of acquisition time values associated with a phasor magnitude and a phasor phase angle of each of the plurality of signal samples; and
   for each of the plurality of signal samples, adjusting the phasor magnitude and the phasor phase angle based on a time difference between a corresponding selected acquisition time value of the plurality of acquisition time values and a predetermined time of the predetermined times referenced to the absolute time standard to form the plurality of synchronized phasors.

25. The method of claim 24, wherein each of the plurality of synchronized phasors comprises a corresponding plurality of referenced phasor magnitudes and referenced phasor phase angles.

26. The method of claim 25, wherein each of the plurality of phasor magnitudes is interpolated to form each of the plurality of referenced phasor magnitudes.

27. The method of claim 25, further comprising the steps of filtering to generate a plurality of filtered signals; phase shifting each of the plurality of filtered signals by 90 degrees; interpolating; and calculating reference phasor magnitudes and referenced phasor angles.

28. The method of claim 25, further comprising the step of calculating an uncalibrated referenced phasor magnitude and a prealigned phasor phase angle of each of the plurality of signal samples at the plurality of acquisition time values prior to adjusting the phasor magnitude and the phasor phase angle to the corresponding plurality of referenced phasor magnitudes and referenced phasor phase angles.

29. The method of claim 25, wherein each of the plurality of phasor phase angles is rotated to form each of the plurality of referenced phasor phase angles.

30. The method of claim 25, further comprising calculating the phasor magnitude and phasor phase angle of each of the plurality of signal samples at the plurality of acquisition time values prior to adjusting the phasor magnitude and the phasor phase angle of each of the plurality of signal samples to the corresponding plurality of referenced phasor magnitudes and referenced phasor phase angles.

31. The method of claim 24, wherein the time difference comprises a difference in time between an occurrence of a preceding selected acquisition time value of the plurality of acquisition time values and a predetermined time of the predetermined times referenced to the absolute time standard.

32. The method of claim 24, wherein the time difference comprises a difference in time between an occurrence of a predetermined time of the predetermined times referenced to the absolute time standard and a next selected acquisition time value of the plurality of acquisition time values.

33. The method of claim 24, wherein the predetermined times are synchronized across the electrical power system.

34. The method of claim 24, wherein the predetermined times are determined at a location on the electrical power system local to the step of determining a frequency of the power system is performed.

35. The method of claim 24, wherein each of the plurality of synchronized phasors is further phase aligned to a reference phasor with predetermined phase and frequency.

36. The method of claim 35, wherein the predetermined frequency comprises 60 Hz.

37. The method of claim 35, wherein the predetermined frequency comprises 50 Hz.

38. The method of claim 24, wherein the power system signal comprises a plurality of power system signals.

39. The method of claim 24, wherein the power system signal is analog filtered prior to the step of sampling.

40. The method of claim 24, wherein the absolute time standard is based on a global positioning system signal communicated via an IRIG timecode protocol.

41. The method of claim 24, wherein each of the plurality of signal samples are digitally filtered.

42. The method of claim 24, wherein the sampling interval rate is an integer multiple of the frequency of the power system signal.

43. The method of claim 24, further comprising utilizing one or more of the plurality of synchronized phasors to perform a power system function selected from the group consisting of: protection, automation, metering, control, and combinations thereof.

44. The method of claim 24, further comprising generating a sample frequency signal based on the sampling interval rate, the sample frequency signal aligned with the plurality of acquisition time values and utilized to form the plurality of synchronized phasors.

45. The method of claim 24, further comprising removing implementation magnitude distortion from the sample frequency signal prior to forming each of the plurality of synchronized phasors.

46. The method of claim 45, further comprising removing implementation phase angle distortion from the sample frequency signal prior to forming each of the plurality of synchronized phasors.

47. The method of claim 24, wherein the power system signal comprises a local analog input signal.

48. The method of claim 24, wherein the power system signal comprises a digitized remote analog input signal.

49. The method of claim 24, wherein each of the plurality of synchronized phasors comprises a corresponding plurality of referenced phasor sequence quantities.

50. A method for estimating a plurality of synchronized phasors at predetermined times referenced to an absolute time standard in an electrical power system, the method comprising:
   acquiring a power system signal
   determining a frequency of the power system signal;
   sampling the power system signal at a sampling interval rate based on a frequency of the power system signal to form a plurality of signal samples;
   generating a plurality of acquisition time values based on an occurrence of each of the plurality signal samples at a corresponding plurality of different times referenced to the absolute time standard, each of the plurality of acquisition time values associated with a phasor magnitude and a phasor phase angle of each of the plurality of signal samples; and for each of the plurality of signal samples, interpolating the phasor magnitude and rotating phasor phase angle to form a corresponding plurality of referenced phasor magnitudes and referenced phasor phase angles of the plurality of synchronized phasors based on a time difference between a corresponding selected acquisition time value of the plurality of acquisition time values and a predetermined time of the predetermined times referenced to the absolute time standard.

51. The method of claim 50, further comprising calculating the phasor magnitude and phasor phase angle of each of the plurality of signal samples at the plurality of acquisition time values prior to adjusting the phasor magnitude and the phasor phase angle of each of the plurality of signal samples to the corresponding plurality of referenced phasor magnitudes and referenced phasor phase angles.

52. The method of claim 50, wherein the rotating phasor phase angle comprises a rotation of 90 degrees.

53. The method of claim 50, further comprising the step of calculating an uncalibrated referenced phasor magnitude and a prealigned phasor phase angle of each of the plurality of signal samples at the plurality of acquisition time values prior to adjusting the phasor magnitude and the phasor phase angle to the corresponding plurality of referenced phasor magnitudes and referenced phasor phase angles.

54. The method of claim 50, wherein the time difference comprises a difference in time between an occurrence of a preceding selected acquisition time value of the plurality of acquisition time values and a predetermined time of the predetermined times referenced to the absolute time standard.

55. The method of claim 50, wherein the time difference comprises a difference in time between an occurrence of a predetermined time of the predetermined times referenced to the absolute time standard and a next selected acquisition time value of the plurality of acquisition time values.

56. The method of claim 50, wherein each of the plurality of synchronized phasors is further phase aligned to a reference phasor with predetermined phase and frequency.

57. The method of claim 56, wherein the predetermined frequency comprises 60 Hz.

58. The method of claim 56, wherein the predetermined frequency comprises 50 Hz.

59. The method of claim 50, wherein the absolute time standard is based on a global positioning system signal communicated via an IRIG timecode protocol.

60. The method of claim 50, wherein each of the plurality of synchronized phasors comprises a corresponding plurality of referenced phasor sequence quantities.

61. The method of claim 50, wherein the power system signal comprises a digitized remote analog input signal.

62. The method of claim 50, wherein the power system signal comprises a local analog input signal.

* * * * *